US012757474B2

(12) United States Patent
Sharma et al.

(10) Patent No.: US 12,757,474 B2
(45) Date of Patent: Oct. 6, 2026

(54) FERROELECTRIC TUNNEL JUNCTION DEVICES FOR LOW VOLTAGE AND LOW TEMPERATURE OPERATION

(71) Applicant: Intel Corporation, Santa Clara, CA (US)

(72) Inventors: Abhishek Anil Sharma, Portland, OR (US); Sagar Suthram, Portland, OR (US); Tahir Ghani, Portland, OR (US); Anand Murthy, Portland, OR (US); Wilfred Gomes, Portland, OR (US); Pushkar Ranade, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 147 days.

(21) Appl. No.: 17/955,209

(22) Filed: Sep. 28, 2022

(65) Prior Publication Data

US 2024/0105811 A1 Mar. 28, 2024

(51) Int. Cl.

| | |
|---|---|
| ***H10D 64/68*** | (2025.01) |
| ***G11C 11/22*** | (2006.01) |
| ***H10B 51/30*** | (2023.01) |
| ***H10B 53/30*** | (2023.01) |
| ***H10D 64/01*** | (2025.01) |

(52) U.S. Cl.

CPC ........... *H10D 64/689* (2025.01); *H10B 51/30* (2023.02); *H10B 53/30* (2023.02); *H10D 64/033* (2025.01); *G11C 11/221* (2013.01)

(58) Field of Classification Search

CPC ...... H10B 51/30; H10B 53/30; H10D 64/033; H10D 64/689

See application file for complete search history.

(56) References Cited

U.S. PATENT DOCUMENTS

| | | | |
|---|---|---|---|
| 6,773,936 B2 | | 8/2004 | Fujiwara et al. |
| 6,876,013 B2 | | 4/2005 | Okano et al. |
| 6,920,061 B2 | | 7/2005 | Bhavnagarwala et al. |
| 10,964,881 B2 | * | 3/2021 | Elmegreen ............. H10N 99/00 |
| 2003/0110788 A1 | | 6/2003 | Koeneman et al. |
| 2004/0129987 A1 | * | 7/2004 | Uchiyama ............ H10D 64/033 257/E21.208 |
| 2005/0047196 A1 | | 3/2005 | Bhavnagarwala et al. |
| 2014/0291616 A1 | | 10/2014 | Park et al. |
| 2016/0351468 A1 | | 12/2016 | Liang |
| 2017/0133298 A1 | | 5/2017 | Gutala et al. |
| 2017/0162252 A1 | | 6/2017 | Ware et al. |

(Continued)

OTHER PUBLICATIONS

Clark, William F. et al., "Low Temperature CMOS—A Brief Review," IEEE Transactions on Components, Hybrids, and Manufacturing Technology, vol. 15, No. 3, Jun. 1992, 9 pgs.

(Continued)

*Primary Examiner* — Steven M Page

(74) *Attorney, Agent, or Firm* — Essential Patents Group, LLP

(57) ABSTRACT

An integrated circuit (IC) die includes a plurality of ferroelectric tunnel junction (FTJ) devices, where at least one FTJ of the plurality of FTJ devices comprises first electrode, a second electrode, ferroelectric material disposed between the first and second electrodes, and interface material disposed between at least one of the first and second electrodes and the ferroelectric material. Other embodiments are disclosed and claimed.

15 Claims, 13 Drawing Sheets

(56) References Cited

U.S. PATENT DOCUMENTS

| | | | | |
|---|---|---|---|---|
| 2017/0194430 | A1 | 7/2017 | Wood et al. | |
| 2018/0158944 | A1 | 6/2018 | Mohapatra et al. | |
| 2018/0175034 | A1 | 6/2018 | Goktepeli et al. | |
| 2018/0211900 | A1 | 7/2018 | Gutala et al. | |
| 2019/0035926 | A1 | 1/2019 | Mohapatra et al. | |
| 2019/0189195 | A1 | 6/2019 | Na et al. | |
| 2019/0198658 | A1 | 6/2019 | Mohapatra et al. | |
| 2020/0044087 | A1 | 2/2020 | Guha et al. | |
| 2020/0176321 | A1 | 6/2020 | Guler et al. | |
| 2021/0056028 | A1 | 2/2021 | Ray et al. | |
| 2021/0202507 | A1* | 7/2021 | Thareja | H10B 53/00 |
| 2021/0202690 | A1* | 7/2021 | Thareja | H10D 1/696 |
| 2021/0342679 | A1* | 11/2021 | Karpov | H10N 70/8836 |
| 2022/0085035 | A1 | 3/2022 | Wang et al. | |
| 2022/0223496 | A1 | 7/2022 | Chanemougame et al. | |
| 2023/0120110 | A1 | 4/2023 | Motoyama et al. | |
| 2023/0317146 | A1 | 10/2023 | Sharma et al. | |
| 2023/0317517 | A1 | 10/2023 | Sharma et al. | |
| 2023/0317851 | A1 | 10/2023 | Sharma et al. | |
| 2023/0318603 | A1 | 10/2023 | Sharma et al. | |
| 2023/0320100 | A1* | 10/2023 | Yamazaki | H10B 51/20 257/295 |
| 2023/0352584 | A1* | 11/2023 | Nikonov | H10D 62/40 |
| 2024/0008286 | A1* | 1/2024 | Sharma | H10B 63/80 |
| 2024/0105811 | A1* | 3/2024 | Sharma | H10B 51/30 |

OTHER PUBLICATIONS

Kajal, Vijay Kumar Sharma, "An efficient low power method for FinFET domino OR logic circuit," Microprocessors and Microsystems 95 (2022) 104719, 9 pgs.

Kulkarni, et al., "5.6 Mb/mm2 1R1W 8T SRAM Arrays Operating Down to 560 mV Utilizing Small-Signal Sensing With Charge Shared Bitline and Asymmetric Sense Amplifier in 14 nm FinFET CMOS Technology," IEEE Journal of Solid State Circuits, vol. 52, No. 1, Jan. 2017.

Kursun, Volkan, et al., "Domino Logic With Variable Threshold Voltage Keeper," IEEE Transactions on Very Large Scale Integration (VLSI) Systems, vol. 11, No. 6, Dec. 2003, 14 pgs.

Paul, Rajesh Kumar., et al., "Analysis of Various Domino Logic Designs for Low Power Consumption, Noise Immunity and High Speed Performance," International Journal of Research Culture Society, vol. 2, Issue 3, Mar. 2018, 8 pgs.

Sharma, Shilpa, et al., "Energy Efficient and High Speed Domino Logic Circuit Design Techniques: An Overview," International Journal of Engineering Research and General Science vol. 3, Issue 3, May-Jun. 2015, 4 pgs.

* cited by examiner

FERROELECTRIC TUNNEL JUNCTION DEVICES FOR LOW VOLTAGE AND LOW TEMPERATURE OPERATION

BACKGROUND

A ferroelectric tunnel junction (FTJ) refers to a tunnel junction with two metal electrodes separated by a thin ferroelectric layer. The polarization of the ferroelectric layer can be switched by an applied electric field. Tunneling electro-resistance (TER) refers to an effect where the electrical resistance of the FTJ depends on an orientation of the electric polarization. For example, TER may result from the switching of ferroelectric polarization due to a change in an electrostatic potential profile across the ferroelectric barrier, a change in a transmission coefficient across interfaces, and/or a change in an attenuation constant of the barrier There is an ongoing need for improved computational devices to enable ever increasing demand for modeling complex systems, providing reduced computation times, and other considerations. In some contexts, scaling features of integrated circuits has been a driving force for such improvements. Other advancements have been made in materials, device structure, circuit layout, and so on. In particular, there is an ongoing desire to improve FTJ device structures that are included in or otherwise support operation of integrated circuits. It is with respect to these and other considerations that the present improvements have been needed. Such improvements may become critical as the desire to improve computational efficiency become even more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements, e.g., with the same or similar functionality. The disclosure will be described with additional specificity and detail through use of the accompanying drawings.

DETAILED DESCRIPTION

Figure 1A:
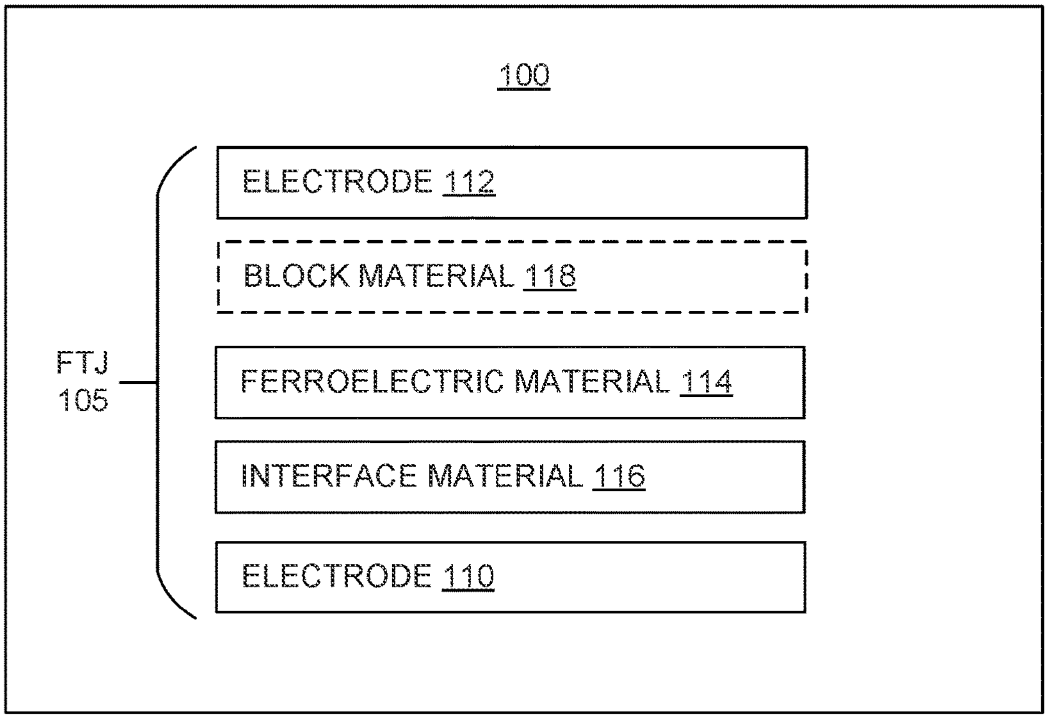
FIG. 1A illustrates a cross-sectional side view of an example integrated circuit (IC) die.

In the following detailed description, reference is made to the accompanying drawings that show, by way of illustration, specific embodiments in which the claimed subject matter may be practiced. These embodiments are described in sufficient detail to enable those skilled in the art to practice the subject matter. The various embodiments, although different, are not necessarily mutually exclusive. For example, a particular feature, structure, or characteristic described herein, in connection with one embodiment, may be implemented within other embodiments without departing from the spirit and scope of the claimed subject matter.

References within this specification to “one embodiment” or “an embodiment” mean that a particular feature, structure, or characteristic described in connection with the embodiment is included in at least one implementation encompassed within the present description. Therefore, the use of the phrase “one embodiment” or “in an embodiment” does not necessarily refer to the same embodiment. In addition, the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled.

The terms “over,” “to,” “between,” and “on” as used herein may refer to a relative position of one layer with respect to other layers. One layer “over” or “on” another layer or bonded “to” another layer may be directly in contact with the other layer or may have one or more intervening layers. One layer “between” layers may be directly in contact with the layers or may have one or more intervening layers.

The terms “coupled” and “connected,” along with their derivatives, may be used herein to describe structural relationships between components. These terms are not intended as synonyms for each other. Rather, in particular embodiments, “connected” may be used to indicate that two or more elements are in direct physical or electrical contact with each other. “Coupled” may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The term “circuit” or “module” may refer to one or more passive and/or active components that are arranged to cooperate with one another to provide a desired function. The term “signal” may refer to at least one current signal, voltage signal, magnetic signal, or data/clock signal. The meaning of "a," "an," and "the" include plural references. The meaning of "in" includes "in" and "on."

The vertical orientation is in the z-direction and recitations of "top," "bottom," "above," and "below" refer to relative positions in the z-dimension with the usual meaning. However, embodiments are not necessarily limited to the orientations or configurations illustrated in the figure. The term "aligned" (i.e., vertically or laterally) indicates at least a portion of the components are aligned in the pertinent direction while "fully aligned" indicates an entirety of the components are aligned in the pertinent direction.

The terms "substantially," "close," "approximately," "near," and "about," generally refer to being within +/−10% of a target value (unless specifically specified). Unless otherwise specified in the specific context of use, the term "predominantly" means more than 50%, or more than half. For example, a composition that is predominantly a first constituent means more than half of the composition is the first constituent. The term "primarily" means the most, or greatest, part. For example, a composition that is primarily a first constituent means the composition has more of the first constituent than any other constituent. A composition that is primarily first and second constituents means the composition has more of the first and second constituents than any other constituent.

Unless otherwise specified, the use of the ordinal adjectives "first," "second," and "third," etc., to describe a common object, merely indicate that different instances of like objects to which are being referred and are not intended to imply that the objects so described must be in a given sequence, either temporally, spatially, in ranking, or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional," "profile," and "plan" correspond to orthogonal planes within a cartesian coordinate system. Thus, cross-sectional and profile views are taken in the x-z and y-z planes, and plan views are taken in the x-y plane. Typically, profile views in the x-z plane are cross-sectional views. Where appropriate, drawings are labeled with axes to indicate the orientation of the figure.

Materials, structures, and techniques are disclosed to improve ferroelectric tunnel junction (FTJ) devices. FTJ devices may find limited utility at room temperature. One problem is that some FTJ devices at room temperature may have a narrower operating voltage range. Another problem is that some FTJ devices at room temperature may have a narrower polarization range. Another problem is that some FTJ devices at room temperature may be more subject to thermal noise. Another problem is that some FTJ devices at room temperature may not be effectively utilized as logic devices. Some embodiments may overcome one or more of the foregoing problems.

Some embodiments may provide technology for FTJ devices for low voltage and low temperature operation. Integrated circuit dies, systems, circuits, and techniques are described herein related to FTJ devices for ultra-low voltage operation. Such FTJ devices may be operable at very low temperatures for improved device performance and/or they may be integrated with complementary metal oxide semiconductor field effect transistors (CMOS FETs) such as FinFETs. Advantageously, examples of a suitably configured FTJ device may operate at low temperature with a broader operating voltage range, a broader polarization range, with less thermal noise, and/or may be effectively utilized as a logic device.

Techniques discussed herein provide advantageous FTJ devices for low voltage applications. In some embodiments, such applications are deployed at very low temperatures, such as, at or below 0° C. For example, the FTJ devices may be deployed in an integrated circuit (IC) die including or coupled to cooling structure operable to remove heat from the IC die to achieve an operating temperature at the very low temperature. As used herein, the term cooling structure or active cooling structure indicates a device that uses power to provide cooling (e.g., via flow of a coolant, immersion in a coolant, etc.). Notably, the cooling structure or active cooling structure need not be in operation to be labeled as such. The active cooling structure may be part of the IC die, provided separate from the IC die, or both. In some contexts, an active cooling structure is not needed as the IC die is deployed in a very low temperature environment such as in any of a subpolar oceanic climate, a subarctic climate, an arctic climate, a tundra climate, an ice cap climate, or any other environment of sustained cold temperatures.

In some embodiments, an FTJ device includes ferroelectric oxide materials, interface materials, and optional blocking materials. At room temperatures, such materials may exhibit relatively narrow polarization behavior at relatively narrow coercive voltage ranges. However, at very low temperatures, suitably configured materials as described herein exhibit broader polarization and coercive voltage range characteristics. For example, at very low temperatures, a suitably configured FTJ device may act as a diode or capacitor that may be deployed in a wide variety of integrated circuit structures.

In deployment at very low temperatures, FTJ devices using such materials systems have suitably wide polarization and voltage characteristics. Therefore, such FTJ devices may advantageously be deployed as various circuits/devices including memory circuits, diodes, metal-insulator-metal (MIM) capacitors, etc. In some embodiments, the FTJ devices are used as diode or MIM capacitor devices at very low voltage. In some implementations, the term very low voltage indicates a voltage of not more than 50 mV, although lower voltages may be used such as voltages of not more than 10 mV. In some embodiments, the FTJ devices are integrated with CMOS FETs such as CMOS FinFETs. Notably, after fabrication of the FTJ devices over a first substrate, the FTJ devices may be layer transferred to a second substrate such as a silicon substrate and the CMOS FETs may be fabricated in an exposed portion of the silicon substrate either on the same side as the FTJ devices or on an opposite side of the FTJ devices. The FTJ devices and CMOS FETs are then integrated into circuits that advantageously use both transistor types at very low temperature. For example, the FTJ devices may be deployed as diodes, MIM capacitors, memory, etc., and the CMOS FETs may be deployed in other circuitry.

As discussed, an IC die including FTJ devices and CMOS FETs may be deployed in a very low temperature context. In some embodiments, the operating temperature of the IC die is maintained at or below 0° C. In some embodiments, the operating temperature of the IC die is maintained at or below about −196° C. (i.e., using liquid nitrogen as the coolant). In some embodiments, the operating temperature of the IC die is maintained at or below about −25° C. In some embodiments, the operating temperature of the IC die is maintained at or below about −50° C. In some embodiments, the operating temperature of the IC die is maintained at or below about −70° C. In some embodiments, the IC die is maintained at or below about −100° C. Other temperatures may be used based on coolant, environment, and so on. Other temperatures may be used based on coolant, environment, and so on. In operation at such very low temperatures, the FTJ devices become operable and the CMOS FETs see a substantial boost in performance relative to operation at higher temperatures inclusive of increased carrier mobility, reduced contact resistance, and reduced leakage.

FIG. 1A shows an illustrative cross-sectional block diagram view of an example integrated circuit (IC) 100 that includes FTJs in accordance with some embodiments. The IC die 100 includes a plurality of FTJ devices, where at least one FTJ device 105 of the plurality of FTJ devices comprises a first electrode 110, a second electrode 112, ferroelectric material 114 disposed between the first and second electrodes 110, 112, and interface material 116 disposed between at least one of the first and second electrodes 110, 112 and the ferroelectric material 114. In some FTJ devices, the interface material 116 is formed in a vertical orientation that spans two or more layers of the IC die 100. In some FTJ devices, the interface material 116 is formed in a horizontal orientation on a single layer of the IC die 100.

The FTJ device 105 may be beneficially utilized by any of a wide variety of useful circuits/devices. For example, the IC die 100 may include a memory circuit that includes the at least one FTJ device 105. In another example, the IC die 100 may include a diode that includes the FTJ device 105. In some example, the FTJ device 105 may further include block material 118 disposed between at least one of the first and second electrodes 110, 112 and the ferroelectric material 114, and the IC die 100 may further include a metal-insulator-metal (MIM) capacitor that includes the FTJ device 105 with the block material 118.

Figure 1B:
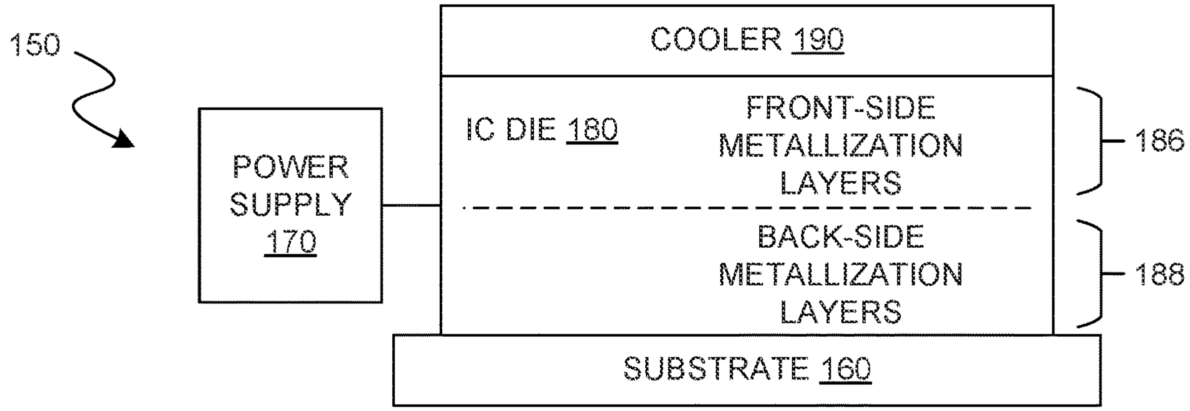
FIG. 1B illustrates a block diagram of an example of a system.

FIG. 1B shows a block diagram view of an example of a system 150 that includes a substrate 160, a power supply 170, and an IC die 180 attached to the substrate 160 and coupled to the power supply 170. The IC die 180 may be similarly configured as any of the various ICs described herein including, for example, the IC die 100 (FIG. 1A), the IC die 500 (FIG. 5), the IC dies 600, 625, 650, 675 (FIGS. 6A-D), and IC die 702 (FIG. 7). Any suitable substrate technology may be utilized for the substrate 160 including, for example, the substrates described herein in connection with FIGS. 7 and 8 (e.g., substrate 805). In some embodiments, the IC die 180 may be coupled to the power supply 170 through the substrate 160.

In some implementations, the IC die 180 may include one or more of a diode and a memory circuit that includes at least one FTJ device (e.g., with the two electrodes and the ferroelectric and interface material between the two electrodes). Additionally, or alternatively, at least one FTJ device may include block material disposed between at least one of the two electrodes and the ferroelectric material, and the IC die 180 may include one or more MIM capacitors that includes the FTJ device(s) with the block material. Embodiments of the FTJ devices may be formed in front-side metallization layers 186 of the IC die 180 and/or back-side metallization layers 188 of the IC die 180.

As shown in FIG. 1B, the system 150 further includes a cooler (e.g., a cooling structure) operable to remove heat from the IC die 180 to achieve an operating temperature at or below −25° C. In some examples, the IC die 180 may include a plurality of metallization layers over a front side of the plurality of FTJ devices (e.g., the front-side metallization layers 186), the metallization layers to provide signal routing for the plurality of FTJ devices, and the cooler 190 may be over the plurality of metallization layers. In some embodiments, the cooler 190 may comprise a plurality of microchannels in the IC die 180 and over the front-side metallization layers 186, the microchannels to convey a heat transfer fluid therein. The cooler 190 may also include a chiller mounted to the IC die 180 over the microchannels, the chiller comprising one of a solid body comprising second microchannels to convey a second heat transfer fluid therein or a heat sink for immersion in a low-boiling point liquid. In some embodiments, the cooler 190 may be configured to convey liquid nitrogen to achieve an operating temperature at or below about −196° C.

Figure 2A:
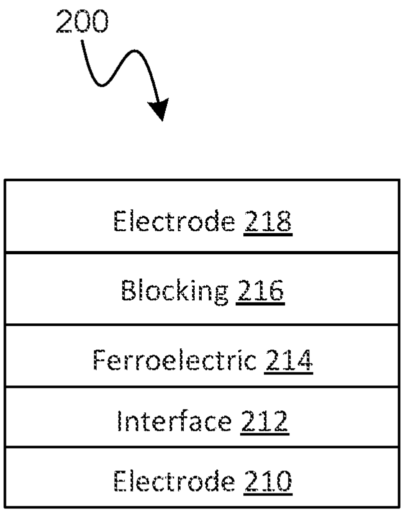
FIG. 2A illustrates a cross sectional side views of an example ferroelectric tunnel junction (FTJ) device.

FIG. 2A shows a cross-sectional side view of an FTJ device 200 for low temperature, low voltage applications. The FTJ device 200 includes a stack of layered materials with an electrode layer 210, an interface layer 212, a ferroelectric layer 214, an optional blocking layer 216, and another electrode layer 218. Any suitable process techniques may be utilized to manufacture the FTJ device 200. In some implementations, atomic layer deposition (ALD) may be utilized to deposit individual stack materials. Any suitable materials of any suitable thickness may be utilized for the various layers. In particular, interface layer 212 and the ferroelectric layer 214 may include a class of materials that benefit from operating at low temperature because the switching voltage of the layered materials becomes bigger at low temperatures. The bigger switching voltage benefits circuit operation because disturb conditions may result if the switching voltage is too low.

Non-limiting example materials for the electrode layers 210 and 218 including any metal material such as nickel (Ni), titanium nitride (TiN), $SrRuO_3$ (SRO), etc. Non-limiting example thicknesses for the electrode layers 210 and 218 range from about 25 nanometers (nm) to 150 nm.

Non-limiting example materials for the interface layer 212 include oxide materials (e.g., such as zinc oxide (ZnO), etc.), dioxide materials and oxi-nitride materials. Non-limiting example thicknesses for the interface layer 212 range from about 10 nm to 300 nm.

Non-limiting example materials for the ferroelectric layer 214 include piezoelectric materials such as hafnium-oxide based materials (e.g., hafnium zirconium oxide (HZO), lanthanum hafnium oxide (LHO), etc.), lead zirconium titanate (PZT), etc. Non-limiting example thicknesses for the ferroelectric layer 214 range from about 25 nm to 2000 nm.

Non-limiting example materials for the optional blocking layer 216 include aluminum oxide materials (e.g., $Al_2O_3$, etc.), silicon oxide materials or hafnium oxide materials. Non-limiting example thicknesses for the blocking layer 216 range from about 10 nm to 300 nm. If the optional blocking layer 216 is included, the FTJ device 200 behaves more like a capacitor than a diode. The optional blocking layer 216 may be anywhere in stack including in the middle of another layer (e.g., splitting that layer).

Figure 2B:
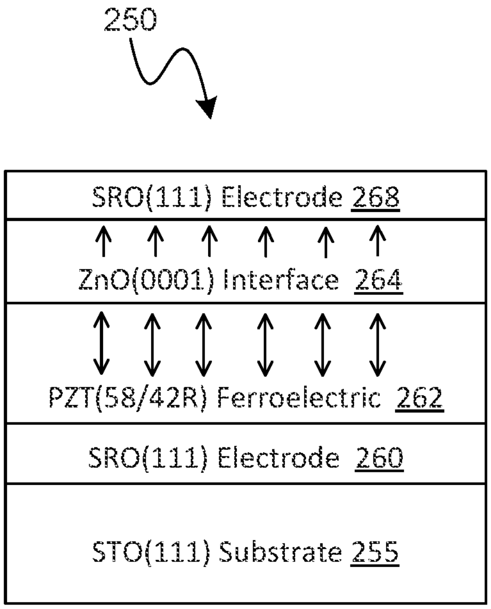
FIG. 2B illustrates a cross sectional side views of another example FTJ device.

FIG. 2B shows a cross-sectional side view of an FTJ device 250 for low temperature, low voltage applications. The FTJ device 250 includes a stack of materials on a substrate 255 with an electrode layer 260, a ferroelectric layer 262, an interface layer 264, and another electrode layer 268. Any suitable process techniques may be utilized to manufacture the FTJ device 250. In some implementations, atomic layer deposition (ALD) may be utilized to deposit individual stack materials. The substrate 255 may comprise $SrTiO_3$ (STO) (e.g., STO(111)). In the FTJ device 250, the two electrode layers 260 and 268 may each comprise SRO (e.g., SRO(111)), the ferroelectric layer 262 may comprise PZT (e.g., PZT(58/42R)), and the interface layer 264 may comprise ZnO (e.g., ZnO(111)). Other implementations may include any suitable materials of any suitable thickness for the various layers. Without the optional blocking layer, the FTJ device 250 may exhibit leaky behavior that makes the devices suitable for use in a circuit as a diode device and/or a logic switch device.

Figure 3A:
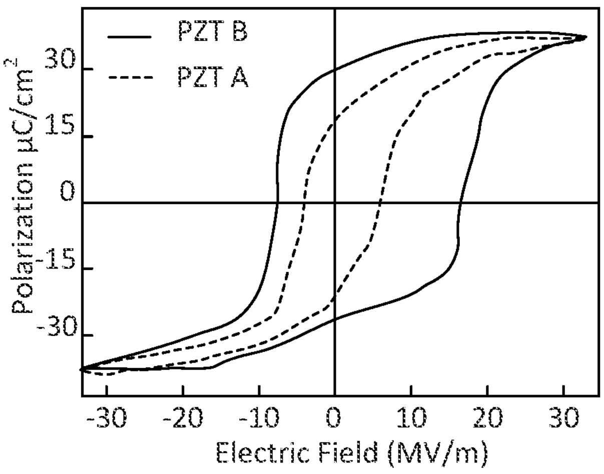
FIGS. 3A to 3D are illustrative graphs of polarization versus electric field hysteresis curves for different thicknesses of PZT materials and a representative PZT material at different temperatures.
Figure 3B:
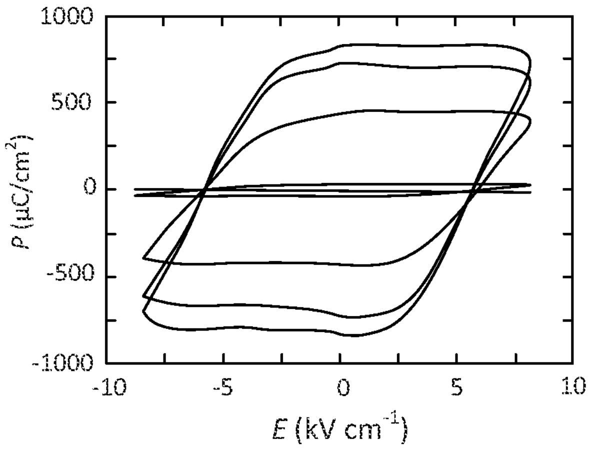
Figure 3C:
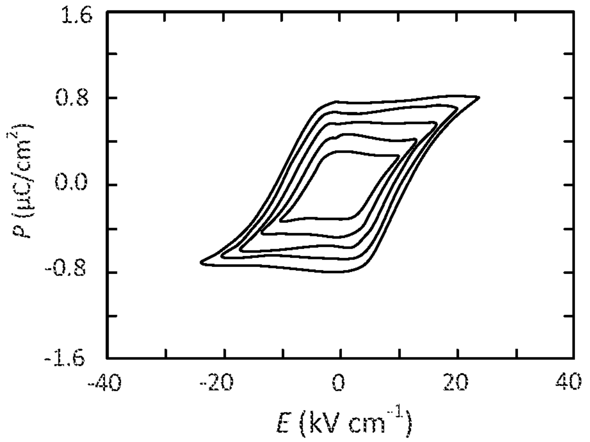
Figure 3D:
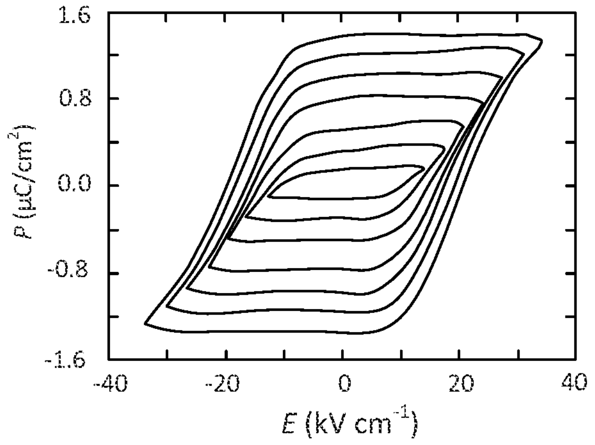

FIGS. 3A to 3D show illustrative graphs of polarization versus electric field hysteresis curves for different thicknesses of PZT materials (FIG. 3A) and a representative PZT material at different temperatures (FIGS. 3B to 3D). At two different temperatures, the outline expands or contracts depending on temperature. In general, the smaller outlines on the graph correspond to higher temperatures and the larger outlines on the graph correspond to lower temperatures. At room temperature there is not much polarization, but as the temperature drops the polarization increases. Different materials have different peak polarization temperatures. By selecting a suitable material for a desired operating temperature, a polarization window opens for FTJ device operation. As shown in FIGS. 3B to 3D, for a given PZT material, lower operating temperatures enable increased operating parameters in both the X (polarization) and Y (voltage) directions (e.g., the polarization window grows in both the X and Y directions).

Figure 4:
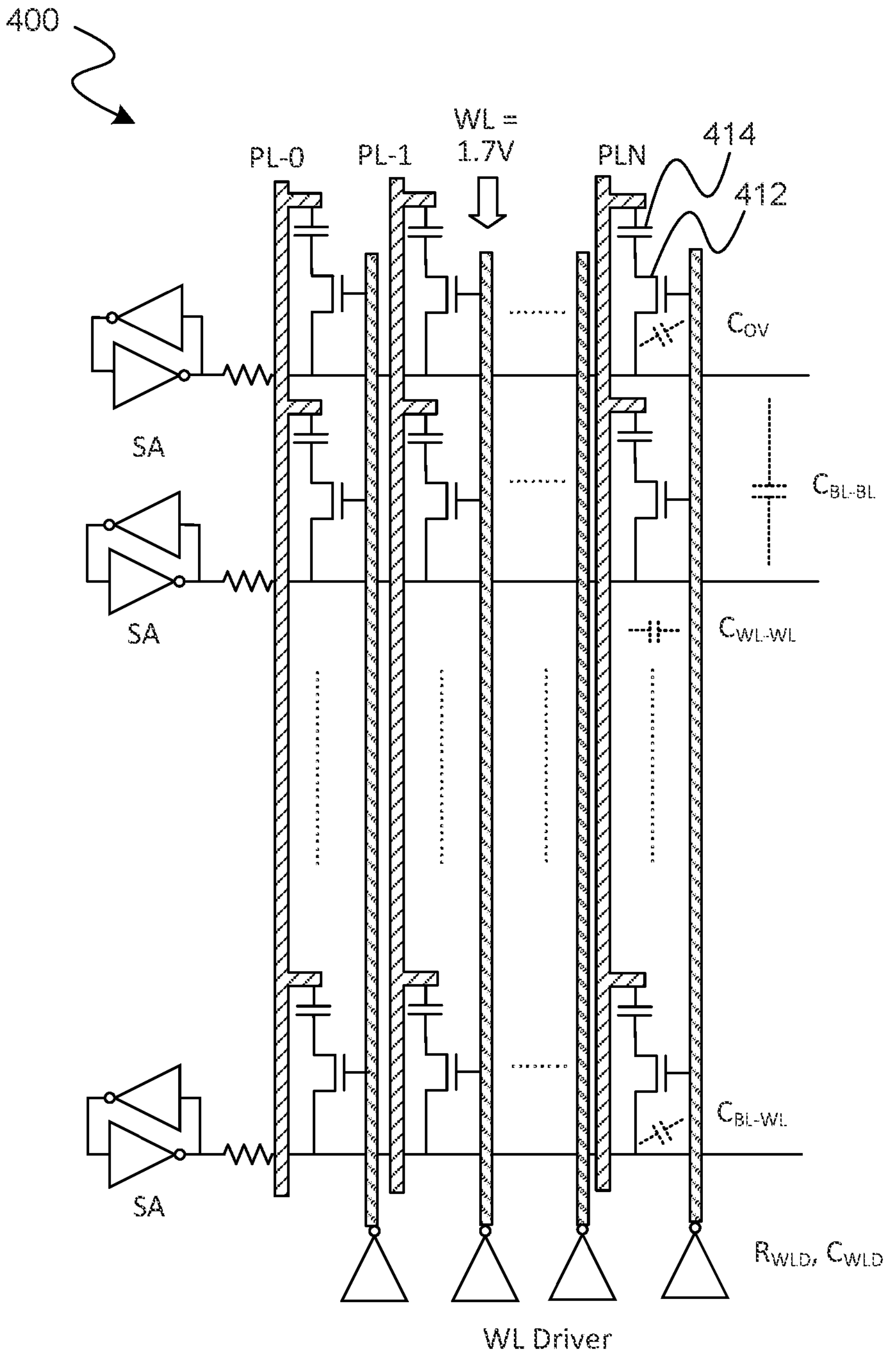
FIG. 4 is a block diagram of a memory circuit.

FIG. 4 shows an embodiment of a memory circuit 400 that includes an array of transistors 412 and capacitors 414 coupled as shown through respective bit lines (BLs) and word lines (WLs) to sense amplifiers (SAs) and WL drivers (WLDs). One terminal of the capacitors 414 for each WL is coupled to respective plate lines (PLs) PL-0 through PL-N (e.g., where N>1). The capacitors 414 in the memory circuit 400 may all include an FTJ device (e.g., with ferroelectric, interface, and blocking layers as described herein).

Figure 5:
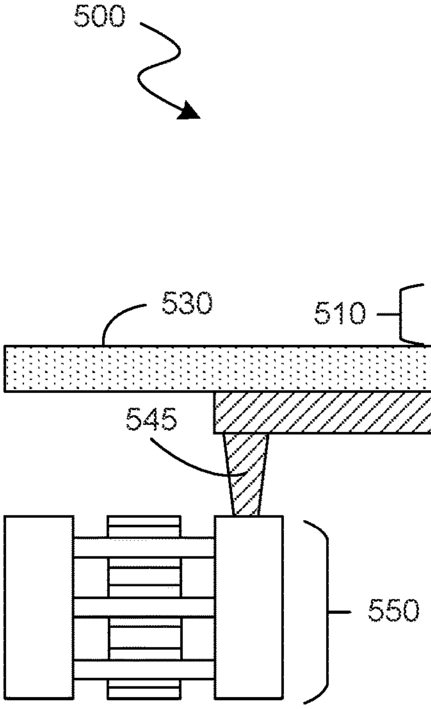
FIG. 5 illustrates cross sectional side views of another example IC die.

FIG. 5 shows a cross-sectional side view of an IC die 500 with FTJ devices 510 in a horizontal orientation. The horizontal FTJ devices 510 include respective horizontal plate top electrodes 512 and horizontal plate bottom electrodes 514 with respective layers 516 of FTJ material as described herein therebetween. For example, the layers 516 include ferroelectric layers and interface layers between the top and bottom electrodes 512, 514. In some of the horizontal FTJ devices 510, the layers 516 may further include an optional blocking layer between the top and bottom electrodes 512, 514. In the illustrated example, the top electrodes 512 are coupled to respective metal circuit lines 520 (e.g., extending into the page). The bottom electrodes 514 are over a dielectric layer 530 and coupled to a metal circuit line 540 by respective vias 535 through the dielectric layer 530. The circuit line 540 is further coupled to a transistor device 550 by a via 545. The illustrated transistor device 550 corresponds to a gate-all-around transistor, but the FTJ devices 510 may be connected to any suitable transistor (e.g., a FinFET) or other types of circuit devices.

FIGS. 6A to 6D show cross-sectional side views of IC dies 600, 625, 650 and 675 with FTJ devices in a horizontal orientation. The horizontal FTJ devices include respective vertical cylindrical outer electrodes and vertical inner electrodes with respective layers of FTJ material as described herein therebetween. For example, the layers of FTJ material include ferroelectric layers and interface layers between the outer and inner electrodes. In some of the vertical FTJ devices, the layers of FTJ material may further include an optional blocking layer between the outer and inner electrodes.

Figure 6A:
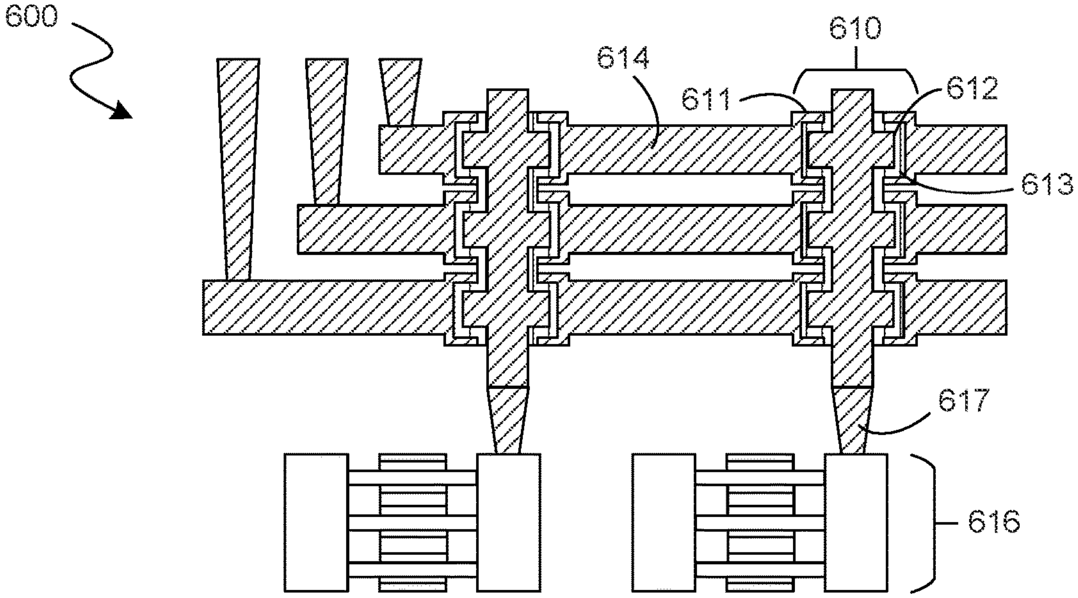
FIGS. 6A to 6D illustrate cross sectional side views of additional example IC dies.
Figure 7:
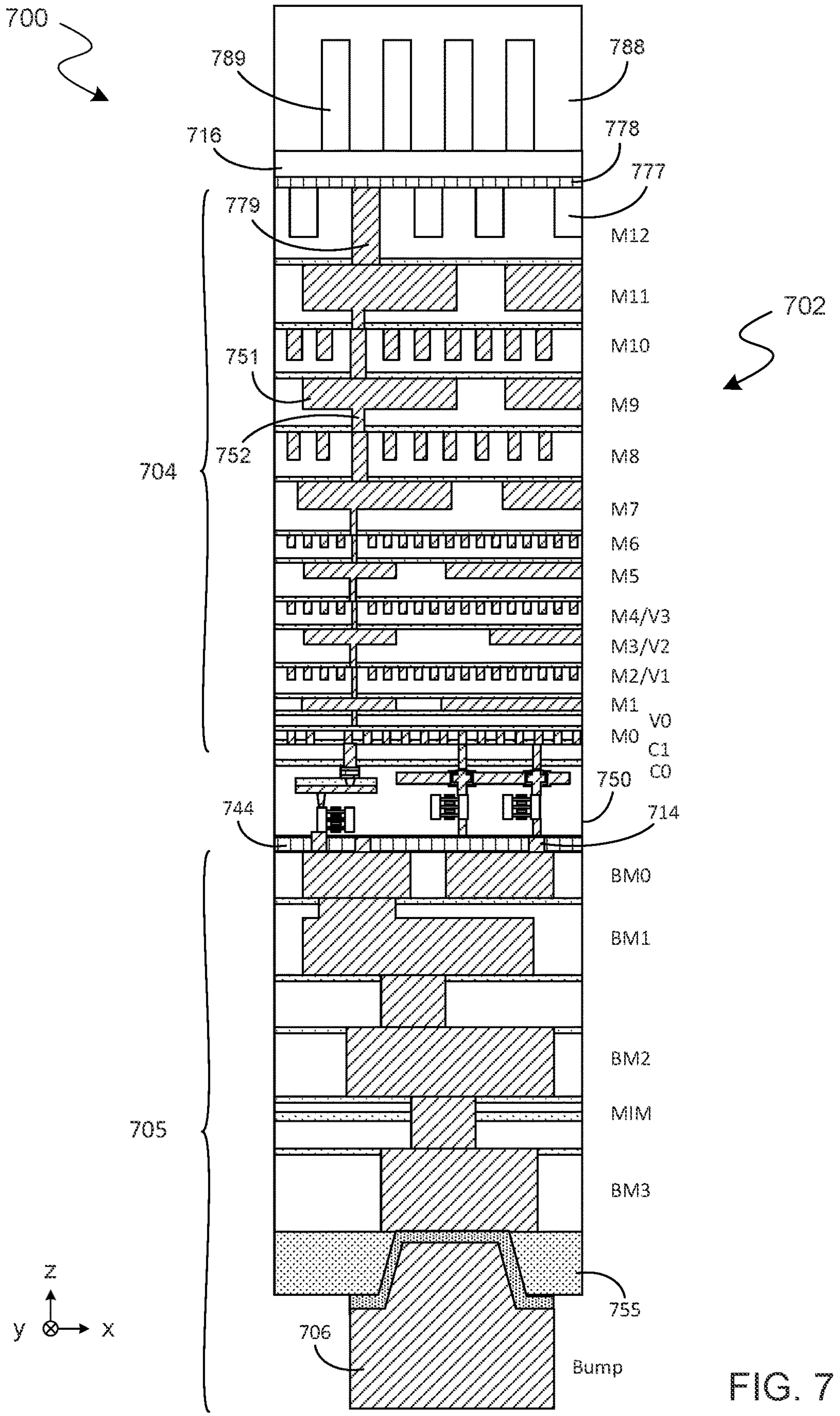
FIG. 7 illustrates a cross-sectional view of a low-temperature IC system with FTJ devices for low voltage and low temperature operation using die- and package-level active cooling.

In FIG. 6A, an FTJ device 610 includes a cup-shaped outer electrode 611 and a cylindrical inner electrode 612 that extends into the outer electrode 611 with the FTJ material

Figure 6B:
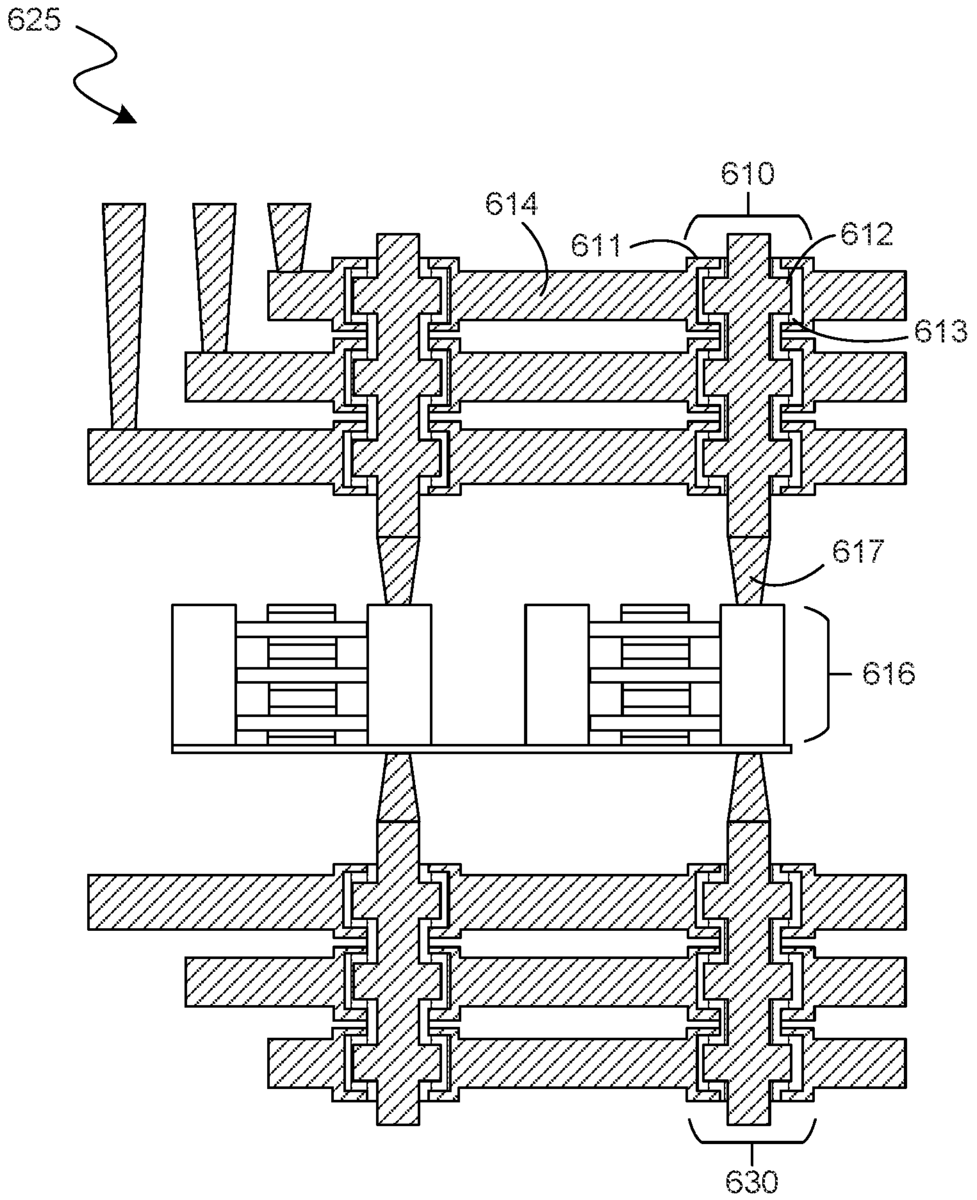

613 therebetween. The outer electrodes 611 are coupled to respective metal circuit lines 614. The inner electrodes 612 are coupled to transistor devices 616 by vias 617. In FIG. 6B, the IC die 625 includes additional FTJ devices 630 coupled to the transistor 616. For example, the circuit structure for the additional FTJ devices 630 may be substantially mirror imaged relative the circuit structure for the FTJ devices 610.

Figure 6C:
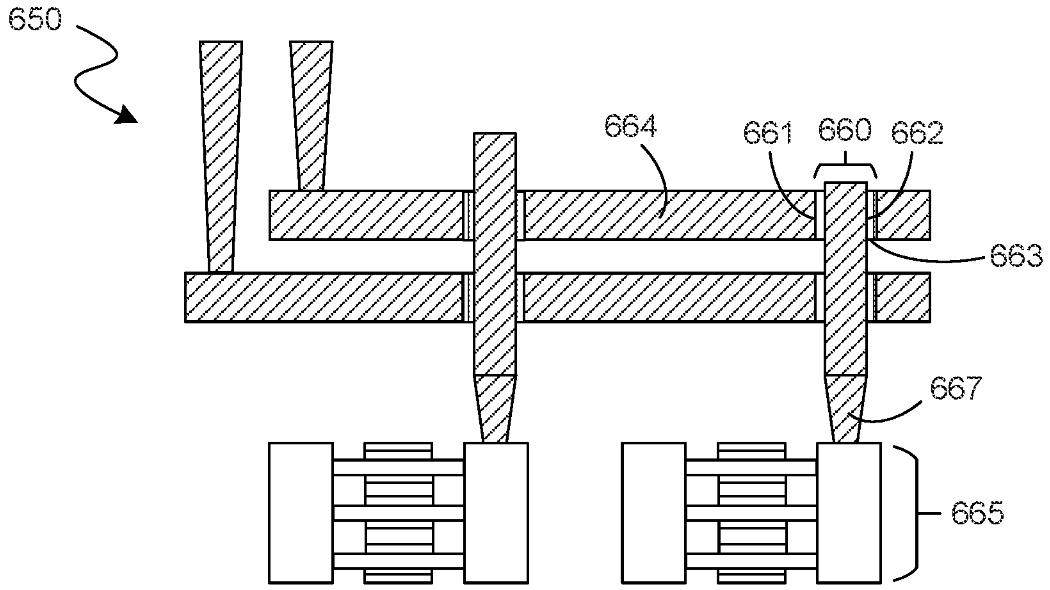
Figure 6D:
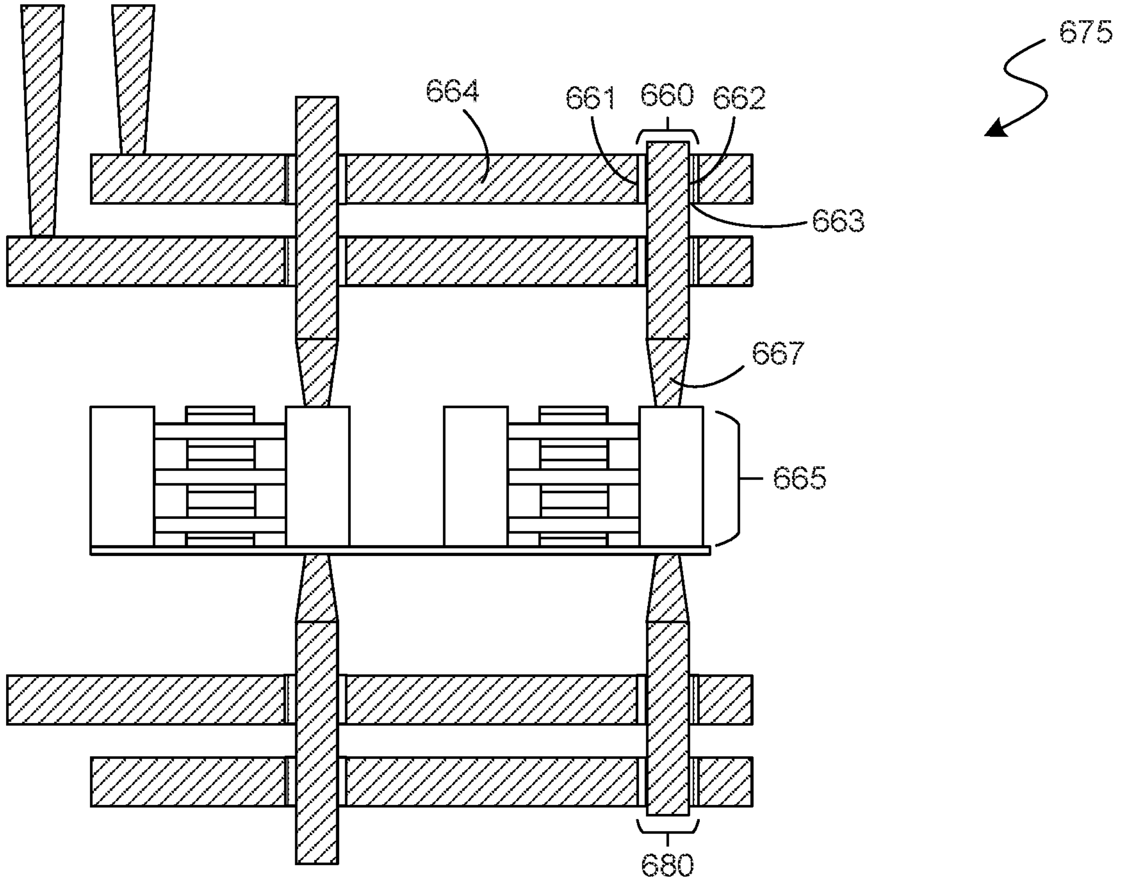

In FIG. 6C, an FTJ device 660 includes a cylindrical outer electrode 661 and a cylindrical inner electrode 662 that is spaced from the outer electrode 611 with the FTJ material 663 therebetween. The outer electrodes 661 are coupled to respective metal circuit lines 664. The inner electrodes 662 are coupled to transistor devices 665 by vias 667. In FIG. 6D, the IC die 675 includes additional FTJ devices 680 coupled to the transistor 665. For example, the circuit structure for the additional FTJ devices 680 may be substantially mirror imaged relative the circuit structure for the FTJ devices 660.

In some embodiments, ICs with FTJ devices may be integrated into a low-temperature system. Lower temperatures enhance conduction in many materials and can enable the use of, e.g., different materials and structures (such as smaller transistor channels). A number of structures may be used to lower the system temperature and so allow for the use of, e.g., smaller conducting structures. Active cooling structures can be used to lower system temperatures to below ambient temperature, even to well below ambient temperature. Active cooling structures can include thermoelectric coolers. In some embodiments, active cooling structures include stacks of alternating p- and n-type semiconductor materials. In some embodiments, active cooling structures flow cooling fluids through channels, including microchannels, thermally coupled to IC packages. In some embodiments, active cooling structures include channels thermally coupled to IC dies 100, 180, 500, 600, 702. In some embodiments, active cooling structures include channels on one or more sides of IC dies 100, 180, 500, 600, 702. In some embodiments, active cooling structures include channels within IC dies 100, 180, 500, 600, 702. In some embodiments, active cooling structures include two-phase cooling. In some embodiments, active cooling structures include low-boiling-point fluids. In some embodiments, active cooling structures include refrigerants as cooling fluids. In some embodiments, active cooling structures lower system temperatures to below 0° C.

FIG. 7 illustrates a cross-sectional view of a low-temperature IC system 700 using die- and package-level active cooling, that includes FTJ devices for low voltage and low temperature operation in accordance with some embodiments. In the example of IC system 700, IC die 702 includes active-cooling structures or components as provided by both die-level microchannels 777 and package-level active-cooling structure 788. IC system 700 includes a lateral surface along the x-y plane that may be defined or taken at any vertical position of IC system 700. The lateral surface of the x-y plane is orthogonal to a vertical or build-up dimension as defined by the z-axis. In some embodiments, IC system 700 may be formed from any substrate material suitable for the fabrication of transistor circuitry. In some embodiments, a semiconductor substrate is used to manufacture FTJ devices and other transistors and components of IC system 700. The semiconductor substrate may include a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as gallium arsenide. The substrate may also include semiconductor materials, metals, dielectrics, dopants, and other materials commonly found in semiconductor substrates.

In FIG. 7, IC system 700 includes an IC die 702, which is a monolithic IC with FTJ devices as described herein, including front-side metallization layers 704 (or front-side interconnect layers), and optional back-side metallization layers 705 (or back-side interconnect layers). As shown, IC die 702 may include FTJ devices embedded within a dielectric layer 750. For example, the FTJ devices embedded within the dielectric layer 750 may include two metallization layers for the electrodes and ferroelectric, interface, and optional blocking layers between the two metallization layers (the detailed structure of the FTJ devices is omitted from the cross-section of FIG. 7 to avoid obscuring the figure). In some embodiments, front-side metallization layers 704 provide signal routing to the non-planar transistors and back-side metallization layers 705 provide power delivery, as enabled by through-contacts 714, and vias. In some embodiments, IC system 700 further includes a package-level cooling structure 788, which may be deployed on or over front-side metallization layers 704 (as shown) or on or over a back-side of IC die 702. In some embodiments, package-level cooling structure 788 is coupled to IC die 702 by an adhesion layer 716. IC system 700 may also be deployed without back-side metallization layers 705 shown in FIG. 7. In such embodiments, signal routing and power are provided to circuits of the IC die 702 via front-side metallization layers 704. However, use of back-side metallization layers 705 may offer advantages.

The circuits of the IC die 702 are connected and thermally coupled by metallization, e.g., metal heat spreader 744, to the entire metallization structure by through-contacts 714. In this way, circuits of the IC die 702 are thermally coupled to both the die-level active-cooling structures (of die-level microchannels 777) and package-level active-cooling structure 788.

Interconnectivity of transistors, signal routing to and from circuitry of the IC die 702, vias 752 (e.g., and other vias), etc., power delivery to circuitry of the IC die 702, etc., and routing to an outside device (not shown), is provided by front-side metallization layers 704, optional back-side metallization layers 705, and package-level interconnects 706. In the example of FIG. 7, package-level interconnects 706 are provided on or over a back-side of IC die 702 as bumps over a passivation layer 755, and IC system 700 is attached to a substrate (and coupled to signal routing to, power delivery, etc.) by package-level interconnects 706. However, package-level interconnects 706 may be provided using any suitable interconnect structures such as bond pads, solder bumps, etc. Furthermore, in some embodiments, package-level interconnects 706 are provided on or over a front-side of IC die 702 (i.e., over front-side metallization layers 704) and package-level cooling structure 788 is provided on or over a back-side of IC die 702.

In IC system 700, IC die 702 includes die-level, active-cooling as provided by die-level microchannels 777. Die-level microchannels 777 are to convey a heat transfer fluid therein to remove heat from IC die 702. The heat transfer fluid may be any suitable liquid or gas. In some embodiments, the heat transfer fluid is liquid nitrogen operable to lower the temperature of IC die 702 to a temperature at or below about −196° C. In some embodiments, the heat transfer fluid is a fluid with a cryogenic temperature operating window (e.g., about −180° C. to about −70° C.). In some embodiments, the heat transfer fluid is one of helium-3, helium-4, hydrogen, neon, air, fluorine, argon, oxygen, or methane.

As used herein, the term "microchannels" indicates a channel to convey a heat transfer fluid with the multiple microchannels providing discrete separate channels or a network of channels. Notably, the plural microchannels does not indicate separate channel networks are needed. Such die-level microchannels 777 may be provided in any pattern in the x-y plane such as serpentine patterns, patterns of multiple parallel die-level microchannels 777, or the like. Die-level microchannels 777 couple to a heat exchanger (not shown) that removes heat from and cools the heat transfer fluid before re-introduction to die-level microchannels 777. The flow of fluid within die-level microchannels 777 may be provided by a pump or other fluid flow device. The operation of the heat exchanger, pump, etc. may be controlled by a controller.

In the illustrated embodiment, die-level microchannels 777 are implemented at metallization level M12. In other embodiments, die-level microchannels 777 are implemented over metallization level M12. Die-level microchannels 777 may be formed using any suitable technique or techniques such as patterning and etch techniques to form the void structures of die-level microchannels 777 and passivation or deposition techniques to form a cover structure 778 to enclose the void structures. As shown, in some embodiments, the die-level, active-cooling structure of IC system 700 includes a number of die-level microchannels 777 in IC die 702 and over a number of front-side metallization layers 704. As discussed, die-level microchannels 777 are to convey a heat transfer fluid therein. In some embodiments, a metallization feature 779 of metallization layer M12 is laterally adjacent to die-level microchannels 777. For example, metallization feature 779 may couple to a package-level interconnect structure (not shown) for signal routing for IC die 702. In some embodiments, a passive heat removal device such as a heat sink or the like may be used instead of or in addition to package-level cooling structure 788. In some embodiments, package-level cooling structure 788 is not deployed in IC system 700.

As used herein, the term "metallization layer" describes layers with interconnections or wires that provide electrical routing, generally formed of metal or other electrically and thermally conductive material. Adjacent metallization layers may be formed of different materials and by different methods. Adjacent metallization layers, such as metallization interconnects 751, are interconnected by vias, such as vias 752, that may be characterized as part of the metallization layers or between the metallization layers. As shown, in some embodiments, front-side metallization layers 704 are formed over and immediately adjacent transistors. The back-side is then the opposite side, which may be exposed during processing by attaching the front-side to a carrier wafer and exposing the back-side (e.g., by back-side grind or etch operations) as known in the art.

In the illustrated example, front-side metallization layers 704 include M0, V0, M1, M2/V1, M3/V2, M4/V3, and M4-M12. However, front-side metallization layers 704 may include any number of metallization layers such as eight or more metallization layers. Similarly, back-side metallization layers 705 include BM0, BM1, BM2, and BM3. However, back-side metallization layers 705 may include any number of metallization layers such as two to five metallization layers. Front-side metallization layers 704 and back-side metallization layers 705 are embedded within dielectric materials. Furthermore, optional metal-insulator-metal (MIM) devices such as diode devices may be provided within back-side metallization layers 705. Other devices such as capacitive memory devices may be provided within front-side metallization layers 704 and/or back-side metallization layers 705.

IC system 700 includes package-level active-cooling structure 788 having package-level microchannels 789. Package-level microchannels 789 are to convey a heat transfer fluid therein to remove heat from IC die 702. The heat transfer fluid may be any suitable liquid or gas as discussed with respect to die-level microchannels 777. Package-level microchannels 789 may be provided in any pattern in the x-y plane such as serpentine patterns, patterns of multiple parallel package-level microchannels 789, etc. Package-level microchannels 789 couple to a heat exchanger (not shown) that removes heat from and cools the heat transfer fluid before re-introduction to package-level microchannels 789. The flow of fluid within package-level microchannels 789 may be provided by a pump or other fluid-flow device. The operation of the heat exchanger, pump, etc. may be controlled by a controller. In the illustrated embodiment, package-level active-cooling structure 788 is a chiller mounted to IC die 702 such that the chiller has a solid body having microchannels therein to convey a heat transfer fluid.

In some embodiments, the heat-removal fluid deployed in die-level microchannels 777 and package-level active-cooling structure 788 are coupled to the same pump and heat exchanger systems. In such embodiments, the heat removal fluid conveyed in both die-level microchannels 777 and package-level active-cooling structure 788 are the same material. Such embodiments may advantageously provide simplicity. In other embodiments, the heat removal fluids are controlled separately. In such embodiments, the heat removal fluids conveyed by die-level microchannels 777 and package-level active-cooling structure 788 may be the same or they may be different. Such embodiments may advantageously provide improved flexibility.

As discussed, IC system 700 includes IC die 702 and optional die-level and package-level active-cooling structures operable to remove heat from IC die 702 to achieve a very low operating temperature of IC die 702. As used herein, the term "very low operating temperature" indicates a temperature at or below 0° C., although even lower temperatures such as an operating temperature at or below −50° C., an operating temperature at or below −70° C., an operating temperature at or below −100° C., an operating temperature at or below −180° C., or an operating temperature at or below −196° C. may be used. In some embodiments, the operating temperature is in a cryogenic temperature operating window (e.g., about −180° C. to about −70° C.). The active-cooling structure may be provided as a package-level structure (i.e., separable from IC die 702), as a die-level structure (i.e., integral to IC die 702), or both. In some embodiments, IC die 702 is deployed in a cold environment, formed using sufficiently conductive materials, etc. and an active-cooling structure is not used.

Figure 8:
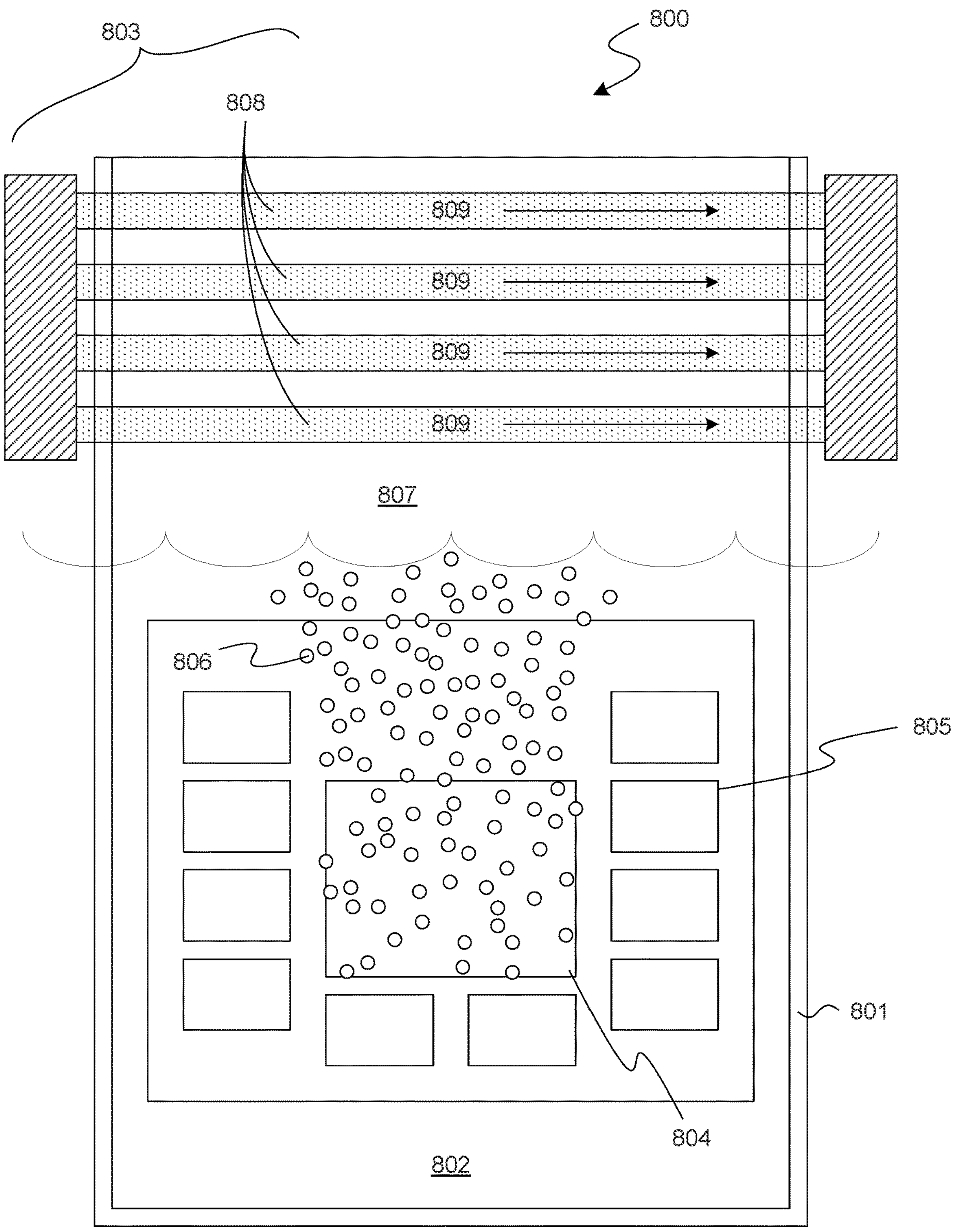
FIG. 8 illustrates a view of an example two-phase immersion cooling system for low-temperature operation of an IC die.

FIG. 8 illustrates a view of an example two-phase immersion cooling system 800 for low-temperature operation of an IC die, in accordance with some embodiments. As shown, two-phase immersion cooling system 800 includes a fluid containment structure 801, a low-boiling point liquid 802 within fluid containment structure 801, and a condensation structure 803 at least partially within fluid containment structure 801. As used herein, the term "low-boiling point liquid" indicates a liquid having a boiling point in the very low temperature ranges discussed. In some embodiments, the low-boiling point liquid is one of helium-3, helium-4, hydrogen, neon, air, fluorine, argon, oxygen, or methane.

In operation, a heat generation source 804, such as an IC package including any of IC dies or systems 100, 150, 500, 600, 625, 650, 675, 700 as discussed herein is immersed in low-boiling point liquid 802. In some embodiments, IC dies or systems 100, 150, 500, 600, 625, 650, 675, 700 as deployed in two-phase immersion cooling system 800 do not include additional active cooling structures, although such die-level or package-level active cooling structures may be used in concert with two-phase immersion cooling system 800. In some embodiments, when deployed in two-phase immersion cooling system 800, package-level active-cooling structure 788 is a heat sink, a heat dissipation plate, a porous heat dissipation plate or the like.

Notably, IC die 702 (or IC die 100, 180, 500, 600, 625, 650, 675), is the source of heat in the context of two-phase immersion cooling system 800. For example, IC die 702 may be packaged and mounted on electronics substrate 805. Electronic substrate 805 may be coupled to a power supply (not shown) and may be partially or completely submerged in low-boiling point liquid 802.

In operation, the heat produced by heat generation source 804 vaporizes low-boiling point liquid 802 as shown in vapor or gas state as bubbles 806, which may collect, due to gravitational forces, above low-boiling point liquid 802 as a vapor portion 807 within fluid containment structure 801. Condensation structure 803 may extend through vapor portion 807. In some embodiments, condensation structure 803 is a heat exchanger having a number of tubes 808 with a cooling fluid (i.e., a fluid colder than the condensation point of vapor portion 807) shown by arrows 809 that may flow through tubes 808 to condense vapor portion 807 back to low-boiling point liquid 802. In the IC system of FIG. 8, package-level active-cooling structure 788 includes a passive cooling structure such as a heat sink for immersion in low-boiling point liquid 802.

Figure 9A:
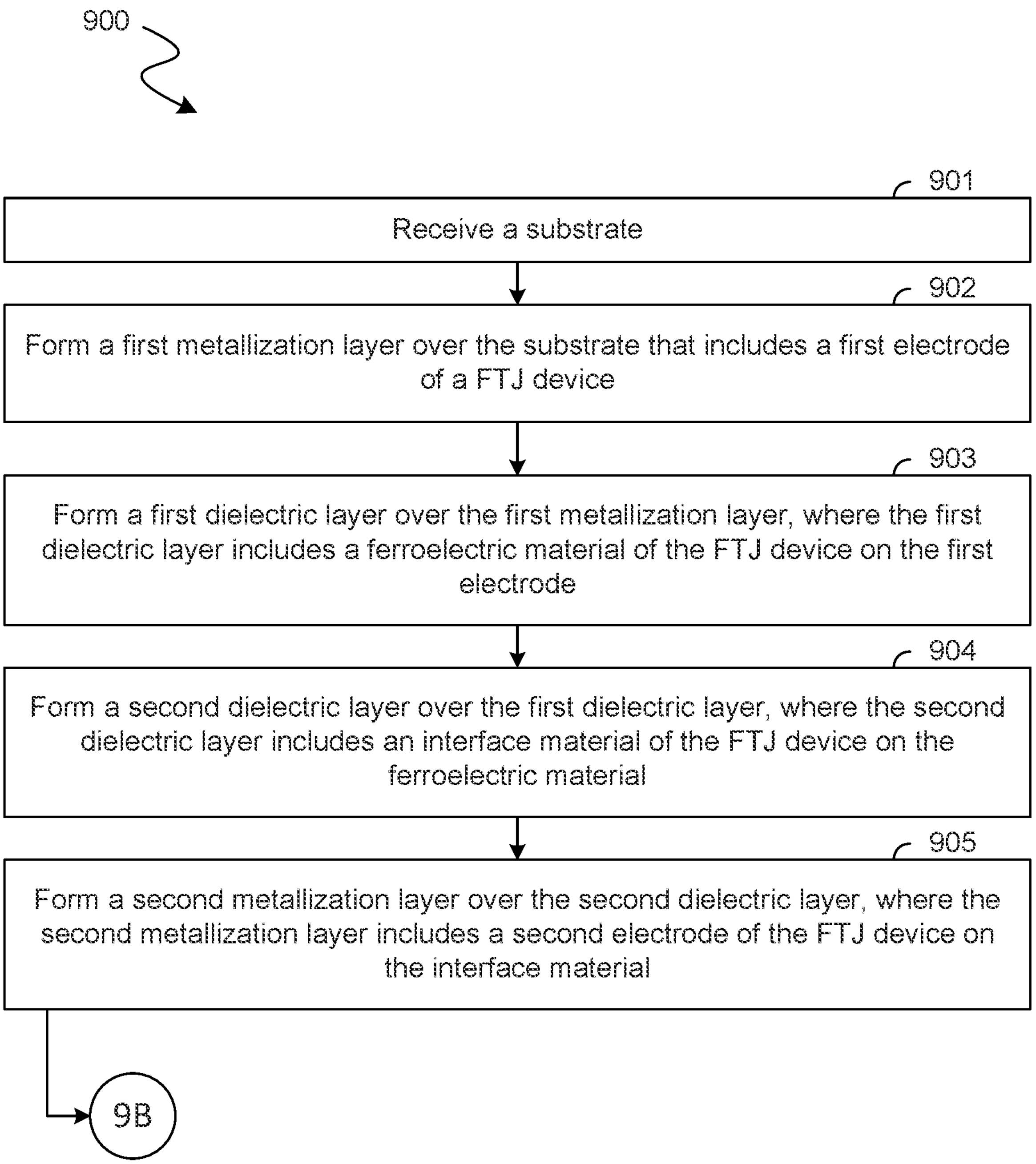
FIGS. 9A to 9B illustrates various processes or methods for forming FTJ devices for low voltage and low temperature operation on an IC die.
Figure 9B:
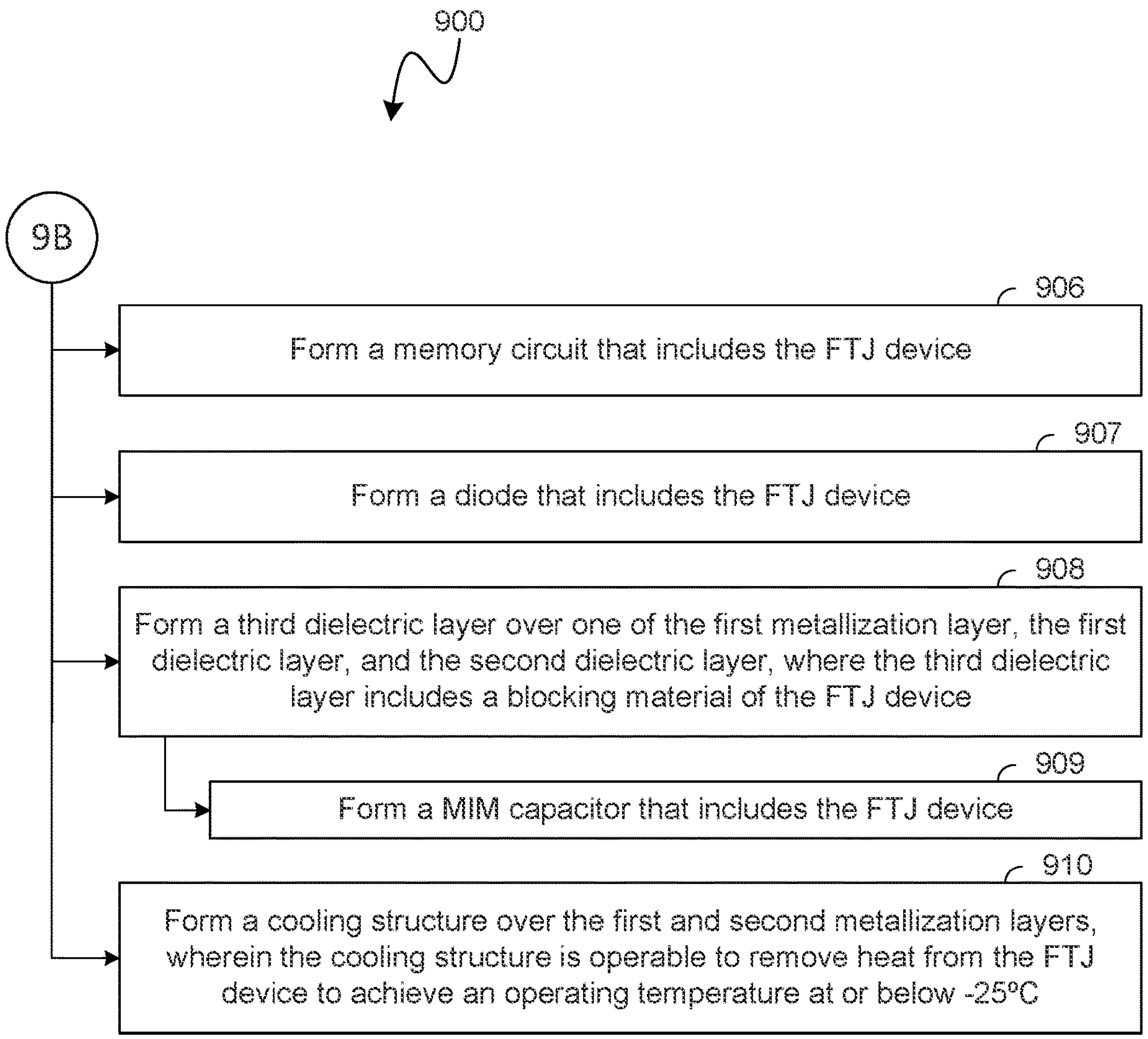

FIGS. 9A to 9B illustrate various processes or methods 900 for forming FTJ devices for low voltage and low temperature operation on an IC die, in accordance with some embodiments. FIGS. 9A to 9B show methods 900 that includes operations 901-910. Some operations shown in FIGS. 9A to 9B are optional. FIGS. 9A to 9B show an example sequence, but the operations can be done in other sequences as well, and some operations may be omitted. Some operations can also be performed multiple times before other operations are performed. Some operations may be included within other operations. Methods 900 generally entail forming FTJ devices with suitable materials and thicknesses for the interface layers and optional blocking layers.

In operation 901, a substrate is received. The substrate is a planar platform and may already include dielectric and metallization structures. The substrate may be one of many layers in an IC die, and may itself have many layers. The substrate may be above other layers in the IC die (all or of a portion of which may be subsequently removed in back-side metallization contexts), and other layers may subsequently be formed in or over the substrate. In some embodiments, FTJ devices for low voltage and low temperature operation will be formed on a frontside of the substrate. In some embodiments, FTJ devices for low voltage and low temperature operation will be formed on a backside. In some embodiments, FTJ devices for low voltage and low temperature operation will be formed on both sides.

The substrate may include any suitable material or materials. Any suitable semiconductor or other material can be used. Transistors in the IC die may be of the same material as the substrate or, e.g., deposited on the substrate. The substrate may include a semiconductor material that transistors can be formed out of and on, including a crystalline material. In some examples, the substrate may include monocrystalline silicon (Si), germanium (Ge), silicon germanium (SiGe), a III-V alloy material (e.g., gallium arsenide (GaAs)), a silicon carbide (SiC), a sapphire (Al2O3), or any combination thereof. In some embodiments, the substrate includes crystalline silicon and subsequent components are also silicon.

In operation 902, a first metallization layer is formed over the substrate that includes a first electrode of an FTJ device. The first metallization layer need not be formed before, e.g., other layers of the IC die. Forming the first metallization layer and other layers of the IC die may include forming transistors, resistors, and interconnections, e.g., between them and with external structures, including power, signal, data, ground, etc. lines. At least some of these structures may be conventional and known methods may be used.

Transistors in the IC die can be formed from the same material as the substrate or, e.g., deposited on the substrate. In some embodiments, the substrate is crystalline silicon and transistors in the first layer are formed by etching back the substrate to form transistor structures, e.g., non-planar structures, such as fins for access transistor channels. In some embodiments, transistors comprise polycrystalline silicon, which may be deposited over other materials. Other semiconductor materials may be deposited as well, on the substrate or over other structures on the substrate. Such semiconductor materials can be any material suitable for forming a transistor channel, e.g., for an access transistor, but some materials will be preferred for their manufacturing properties, e.g., the capability to be deposited easily, in a well-controlled manner, and in thin layers.

Forming the transistors may include forming ultrathin structures, such as nanowires, nanoribbons, or nanosheets, for transistor channels. In some embodiments, one or a few monolayers of semiconductor materials are deposited over the substrate or other structures. In some embodiments, less than 2 nm of semiconductor material is deposited as a film. In some embodiments, a transition-metal dichalcogenide (TMD) material is deposited to form access transistors. TMDs can be 2D materials, e.g., forming monolayers of semiconductor materials. 2D materials may be deposited on structures, such as backbone features, deposited on the substrate.

The methods for forming transistors may vary with transistor function. TFTs for use as pull-up transistors may be formed as parasitic devices deposited over other structures in some layers. In some embodiments, forming transistors includes depositing amorphous or polycrystalline metal oxides. In some embodiments, a thin, metal-oxide film is deposited that may be semiconducting substantially as-deposited, and/or following some subsequent activation process, such as a thermal anneal.

Other structures, e.g., resistors and metallization, may also be deposited or otherwise formed from such materials, and such forming may be done throughout the forming operations of transistors and other structures. Pull-up resistors may be formed from the substrate material or, e.g., by depositing polycrystalline silicon or other material over the substrate. Other structures, e.g., access transistor gate electrodes, may be formed such that convenient connections can be made to associated structures in the first layer. Metallization may be formed before and after, and interleaved throughout, the forming of other structures.

At operation 903, a first dielectric layer is formed over the first metallization layer, where the first dielectric layer includes a ferroelectric material of the FTJ device on the first electrode. At operation 904, a second dielectric layer is formed over the first dielectric layer, where the second dielectric layer includes an interface material of the FTJ device on the ferroelectric material. At operation 905, forming a second metallization layer over the second dielectric layer, where the second metallization layer includes a second electrode of the FTJ device on the interface material.

The first dielectric layer and interface layer are formed in or on the substrate and in a layer vertically adjacent the first metallization layer. The second metallization layer may be formed after the first dielectric layer and interface layer. Structures in vertically adjacent layers may be deposited or grown over the top of the prior layers. Structures formed, e.g., etched, from a front side of the substrate in one layer may be formed, e.g., etched, from a back side of the substrate in another layer. Layouts may be duplicated or mirrored as suits an embodiment.

In operation 906, a memory circuit is formed that includes the FTJ device. In operation 907, forming a diode that includes the FTJ device. In operation 908, form a third dielectric layer over one of the first metallization layer, the first dielectric layer, and the second dielectric layer, where the third dielectric layer includes a blocking material of the FTJ device. In operation 909, a MIM capacitor is formed that includes the FTJ device. In operation 910, a cooling structure is formed over the first and second metallization layers, wherein the cooling structure is operable to remove heat from the FTJ device to achieve an operating temperature at or below −25° C.

In some embodiments, two circuits or signals (and more) are formed in vertically adjacent layers where in different metallization layers are connected between layers by forming a vertical metallization structure, e.g., a metallized via connection, on one side of the layers, beyond the horizontal edges or boundaries of the circuits. In some such embodiments, a deep border via connects the different metallization layers. In some embodiments, two of these connected circuits are vertically aligned, and other connected circuits in both layers are not vertically aligned. The vertical metallization structure, e.g., a via, can be formed as part of traditional or other methods, e.g. single or dual damascene techniques, etc.

Figure 10:
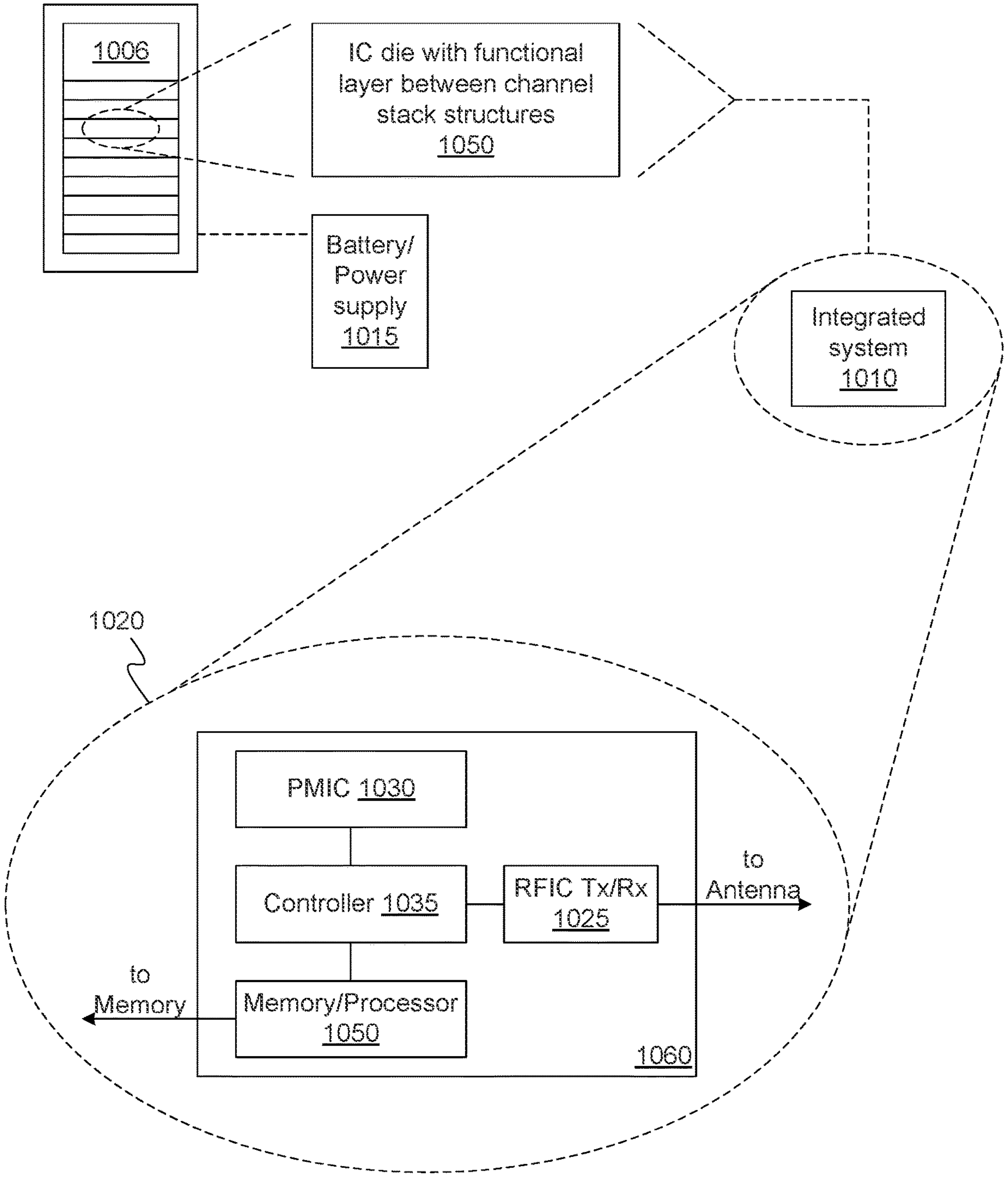
FIG. 10 illustrates a diagram of an example data server machine employing an IC die with FTJ devices for low voltage and low temperature operation.

FIG. 10 illustrates a diagram of an example data server machine 1006 employing an IC die with FTJ devices for low voltage and low temperature operation, in accordance with some embodiments. Server machine 1006 may be any commercial server, for example, including any number of high-performance computing platforms disposed within a rack and networked together for electronic data processing, which in the exemplary embodiment includes one or more devices 1050 having FTJ devices for low voltage and low temperature operation.

Also as shown, server machine 1006 includes a battery and/or power supply 1015 to provide power to devices 1050, and to provide, in some embodiments, power delivery functions such as power regulation. Devices 1050 may be deployed as part of a package-level integrated system 1010. Integrated system 1010 is further illustrated in the expanded view 1020. In the exemplary embodiment, devices 1050 (labeled "Memory/Processor") includes at least one memory chip (e.g., RAM), and/or at least one processor chip (e.g., a microprocessor, a multi-core microprocessor, or graphics processor, or the like) having the characteristics discussed herein. In an embodiment, device 1050 is a microprocessor including a cache memory. As shown, device 1050 may be a multi-chip module employing one or more IC dies with FTJ devices for low voltage and low temperature operation, as discussed herein. Device 1050 may be further coupled to (e.g., communicatively coupled to) a board, an interposer, or a substrate 1060 along with, one or more of a power management IC (PMIC) 1030, RF (wireless) IC (RFIC) 1025, including a wideband RF (wireless) transmitter and/or receiver (TX/RX) (e.g., including a digital baseband and an analog front end module further comprises a power amplifier on a transmit path and a low noise amplifier on a receive path), and a controller 1035 thereof. In some embodiments, RFIC 1025, PMIC 1030, controller 1035, and device 1050 include IC dies having FTJ devices for low voltage and low temperature operation on substrate 1060 in a multi-chip module.

Figure 11:
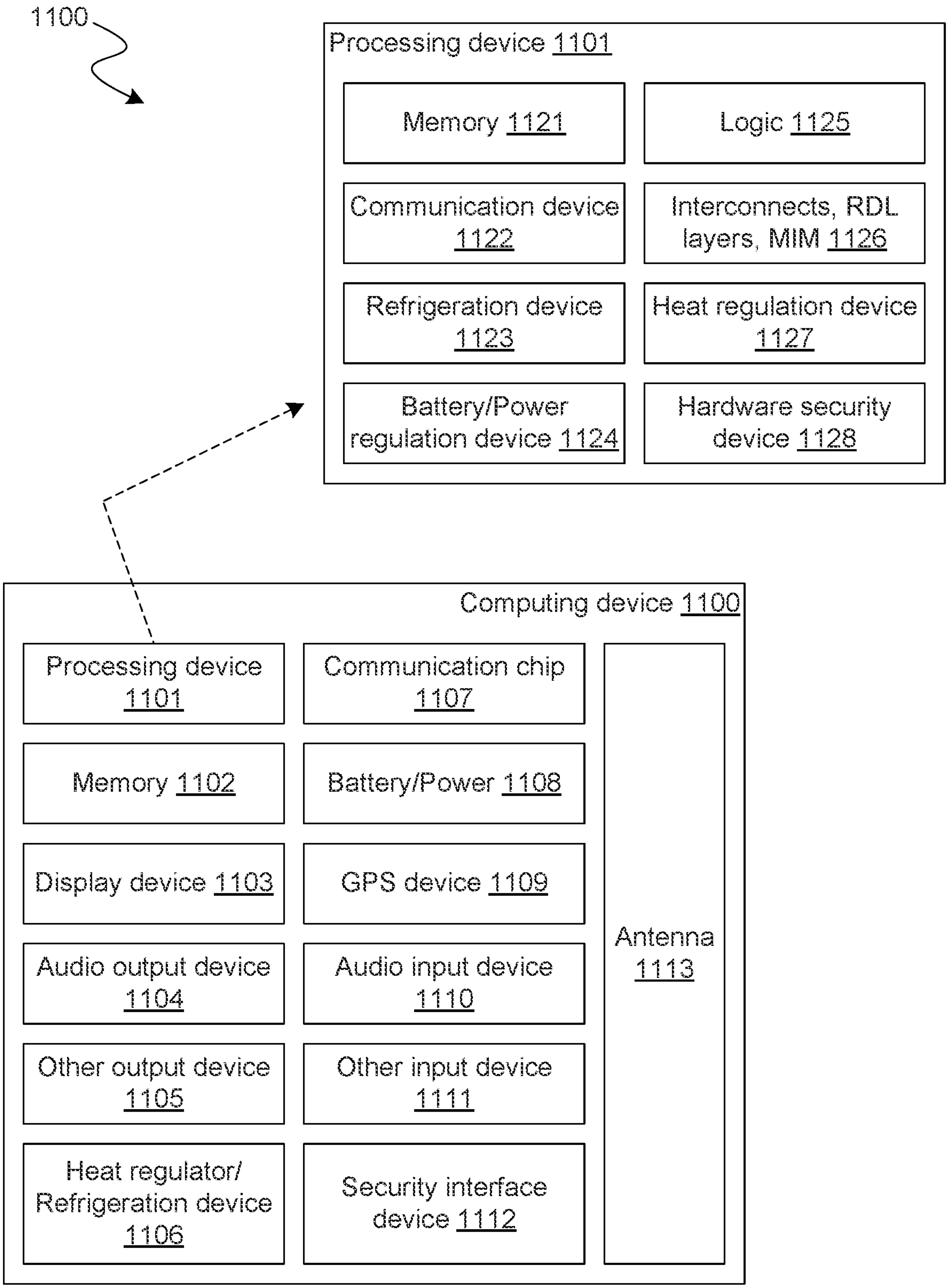
FIG. 11 is a block diagram of an example computing device, all in accordance with at least some implementations of the present disclosure.

FIG. 11 is a block diagram of an example computing device 1100, in accordance with some embodiments. For example, one or more components of computing device 1100 may include any of the devices or structures discussed herein. A number of components are illustrated in FIG. 11 as being included in computing device 1100, but any one or more of these components may be omitted or duplicated, as suitable for the application. In some embodiments, some or all of the components included in computing device 1100 may be attached to one or more printed circuit boards (e.g., a motherboard). In some embodiments, various ones of these components may be fabricated onto a single system-on-a-chip (SoC) die. Additionally, in various embodiments, computing device 1100 may not include one or more of the components illustrated in FIG. 11, but computing device 1100 may include interface circuitry for coupling to the one or more components. For example, computing device 1100 may not include a display device 1103, but may include display device interface circuitry (e.g., a connector and driver circuitry) to which display device 1103 may be coupled. In another set of examples, computing device 1100 may not include an audio output device 1104, other output device 1105, global positioning system (GPS) device 1109, audio input device 1110, or other input device 1111, but may include audio output device interface circuitry, other output device interface circuitry, GPS device interface circuitry, audio input device interface circuitry, audio input device interface circuitry, to which audio output device 1104, other output device 1105, GPS device 1109, audio input device 1110, or other input device 1111 may be coupled.

Computing device 1100 may include a processing device 1101 (e.g., one or more processing devices). As used herein, the term "processing device" or "processor" indicates a device that processes electronic data from registers and/or memory to transform that electronic data into other electronic data that may be stored in registers and/or memory. Processing device 1101 may include a memory 1121, a communication device 1122, a refrigeration device 1123, a battery/power regulation device 1124, logic 1125, interconnects 1126 (i.e., optionally including redistribution layers (RDL) or metal-insulator-metal (MIM) devices), a heat regulation device 1127, and a hardware security device 1128.

Processing device 1101 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

Computing device 1100 may include a memory 1102, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 1102 includes memory that shares a die with processing device 1101. This memory may be used as cache memory and may include embedded dynamic random-access memory (eDRAM) or spin transfer torque magnetic random-access memory (STT-M RAM).

Computing device 1100 may include a heat regulation/refrigeration device 1106. Heat regulation/refrigeration device 1106 may maintain processing device 1101 (and/or other components of computing device 1100) at a predetermined low temperature during operation. This predetermined low temperature may be any temperature discussed herein.

In some embodiments, computing device 1100 may include a communication chip 1107 (e.g., one or more communication chips). For example, the communication chip 1107 may be configured for managing wireless communications for the transfer of data to and from computing device 1100. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 1107 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1107 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1107 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1107 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1107 may operate in accordance with other wireless protocols in other embodiments. Computing device 1100 may include an antenna 1113 to facilitate wireless communications and/or to receive other wireless communications (such as AM or FM radio transmissions).

In some embodiments, communication chip 1107 may manage wired communications, such as electrical, optical, or any other suitable communication protocols (e.g., the Ethernet). As noted above, communication chip 1107 may include multiple communication chips. For instance, a first communication chip 1107 may be dedicated to shorter-range wireless communications such as Wi-Fi or Bluetooth, and a second communication chip 1107 may be dedicated to longer-range wireless communications such as GPS, EDGE, GPRS, CDMA, WiMAX, LTE, EV-DO, or others. In some embodiments, a first communication chip 1107 may be dedicated to wireless communications, and a second communication chip 1107 may be dedicated to wired communications.

Computing device 1100 may include battery/power circuitry 1108. Battery/power circuitry 1108 may include one or more energy storage devices (e.g., batteries or capacitors) and/or circuitry for coupling components of computing device 1100 to an energy source separate from computing device 1100 (e.g., AC line power).

Computing device 1100 may include a display device 1103 (or corresponding interface circuitry, as discussed above). Display device 1103 may include any visual indicators, such as a heads-up display, a computer monitor, a projector, a touchscreen display, a liquid crystal display (LCD), a light-emitting diode display, or a flat panel display, for example.

Computing device 1100 may include an audio output device 1104 (or corresponding interface circuitry, as discussed above). Audio output device 1104 may include any device that generates an audible indicator, such as speakers, headsets, or earbuds, for example.

Computing device 1100 may include an audio input device 1110 (or corresponding interface circuitry, as discussed above). Audio input device 1110 may include any device that generates a signal representative of a sound, such as microphones, microphone arrays, or digital instruments (e.g., instruments having a musical instrument digital interface (MIDI) output).

Computing device 1100 may include a GPS device 1109 (or corresponding interface circuitry, as discussed above). GPS device 1109 may be in communication with a satellite-based system and may receive a location of computing device 1100, as known in the art.

Computing device 1100 may include other output device 1105 (or corresponding interface circuitry, as discussed above). Examples of the other output device 1105 may include an audio codec, a video codec, a printer, a wired or wireless transmitter for providing information to other devices, or an additional storage device.

Computing device 1100 may include other input device 1111 (or corresponding interface circuitry, as discussed above). Examples of the other input device 1111 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1100 may include a security interface device 1112. Security interface device 1112 may include any device that provides security measures for computing device 1100 such as intrusion detection, biometric validation, security encode or decode, access list management, malware detection, or spyware detection.

Computing device 1100, or a subset of its components, may have any appropriate form factor, such as a hand-held or mobile computing device (e.g., a cell phone, a smart phone, a mobile internet device, a music player, a tablet computer, a laptop computer, a netbook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The subject matter of the present description is not necessarily limited to specific applications illustrated in FIGS. 1A-11. The subject matter may be applied to other deposition applications, as well as any appropriate manufacturing application, as will be understood to those skilled in the art.

The following examples pertain to further embodiments, and specifics in the examples may be used anywhere in one or more embodiments.

Example 1 includes an IC die, comprising a plurality of FTJ devices, wherein at least one FTJ of the plurality of FTJ devices comprises first electrode, a second electrode, ferroelectric material disposed between the first and second electrodes, and interface material disposed between at least one of the first and second electrodes and the ferroelectric material.

Example 2 includes the IC die of Example 1, wherein the interface material is formed in a vertical orientation that spans two or more layers of the IC die.

Example 3 includes the IC die of Example 1, wherein the interface material is formed in a horizontal orientation on a single layer of the IC die.

Example 4 includes the IC die of any of Examples 1 to 3, further comprising a memory circuit that includes the at least one FTJ device.

Example 5 includes the IC die of any of Examples 1 to 3, further comprising a diode that includes the at least one FTJ device.

Example 6 includes the IC die of any of Examples 1 to 3, further comprising block material disposed between at least one of the first and second electrodes and the ferroelectric material.

Example 7 includes the IC die of Example 6, further comprising a MIM capacitor that includes the at least one FTJ device.

Example 8 includes a system, comprising a substrate, a power supply, and an IC die attached to the substrate and coupled to the power supply, the IC die comprising a plurality of FTJ devices, wherein at least one FTJ of the plurality of FTJ devices comprises a first electrode, a second electrode, ferroelectric material disposed between the first and second electrodes, and interface material disposed between at least one of the first and second electrodes and the ferroelectric material.

Example 9 includes the system of Example 8, further comprising one or more of a diode and a memory circuit that includes the at least one FTJ device.

Example 10 includes the system of Example 8, wherein the at least one FTJ device further comprises block material disposed between at least one of the first and second electrodes and the ferroelectric material.

Example 11 includes the system of Example 10, further comprising a MIM capacitor that includes the at least one FTJ device.

Example 12 includes the system of any of Examples 8 to 11, further comprising a cooling structure operable to remove heat from the IC die to achieve an operating temperature at or below −25° C.

Example 13 includes the system of Example 12, wherein the IC die comprises a plurality of metallization layers over a front side of the plurality of FTJ devices, the metallization layers to provide signal routing for the plurality of FTJ devices, and wherein the cooling structure is over the plurality of metallization layers.

Example 14 includes the system of Example 13, wherein the cooling structure comprises a plurality of microchannels in the IC die and over the plurality of metallization layers, the microchannels to convey a heat transfer fluid therein.

Example 15 includes the system of Example 14, wherein the cooling structure further comprises a chiller mounted to the IC die over the microchannels, the chiller comprising one of a solid body comprising second microchannels to convey a second heat transfer fluid therein or a heat sink for immersion in a low-boiling point liquid.

Example 16 includes the system of any of Examples 12 to 15, wherein the cooling structure is to convey liquid nitrogen to achieve an operating temperature at or below about −196° C.

Example 17 includes a method, comprising receiving a substrate, forming a first metallization layer over the substrate that includes a first electrode of a FTJ device, forming a first dielectric layer over the first metallization layer, wherein the first dielectric layer includes a ferroelectric material of the FTJ device on the first electrode, forming a second dielectric layer over the first dielectric layer, wherein the second dielectric layer includes an interface material of the FTJ device on the ferroelectric material, and forming a second metallization layer over the second dielectric layer, wherein the second metallization layer includes a second electrode of the FTJ device on the interface material.

Example 18 includes the method of Example 17, further comprising forming a memory circuit that includes the FTJ device.

Example 19 includes the method of Example 17, further comprising forming a diode that includes the FTJ device.

Example 20 includes the method of Example 17, further comprising forming a third dielectric layer over one of the first metallization layer, the first dielectric layer, and the second dielectric layer, wherein the third dielectric layer includes a blocking material of the FTJ device.

Example 21 includes the method of Example 20, further comprising forming a MIM capacitor that includes the FTJ device.

Example 22 includes the method of any of Examples 17 to 21, further comprising forming a cooling structure over the first and second metallization layers, wherein the cooling structure is operable to remove heat from the FTJ device to achieve an operating temperature at or below −25° C.

Example 23 includes an apparatus, comprising means for receiving a substrate, means for forming a first metallization layer over the substrate that includes a first electrode of a FTJ device, means for forming a first dielectric layer over the first metallization layer, wherein the first dielectric layer includes a ferroelectric material of the FTJ device on the first electrode, means for forming a second dielectric layer over the first dielectric layer, wherein the second dielectric layer includes an interface material of the FTJ device on the ferroelectric material, and means for forming a second metallization layer over the second dielectric layer, wherein the second metallization layer includes a second electrode of the FTJ device on the interface material.

Example 24 includes the apparatus of Example 23, further comprising means for forming a memory circuit that includes the FTJ device.

Example 25 includes the apparatus of Example 23, further comprising means for forming a diode that includes the FTJ device.

Example 26 includes the apparatus of Example 23, further comprising means for forming a third dielectric layer over one of the first metallization layer, the first dielectric layer, and the second dielectric layer, wherein the third dielectric layer includes a blocking material of the FTJ device.

Example 27 includes the apparatus of Example 26, further comprising means for forming a MIM capacitor that includes the FTJ device.

Example 28 includes the apparatus of any of Examples 23 to 27, further comprising means for forming a cooling structure over the first and second metallization layers, wherein the cooling structure is operable to remove heat from the FTJ device to achieve an operating temperature at or below −25° C.

The disclosure can be practiced with modification and alteration, and the scope of the appended claims is not limited to the embodiments so described. For example, the above embodiments may include specific combinations of features. However, the above embodiments are not limiting in this regard and, in various implementations, the above embodiments may include the undertaking only a subset of such features, undertaking a different order of such features, undertaking a different combination of such features, and/or undertaking additional features than those features explicitly listed. The scope of the patent rights should, therefore, be determined with reference to the appended claims, along with the full scope of equivalents to which such claims are entitled.

We claim:

1. An integrated circuit (IC) die, comprising:

a plurality of ferroelectric tunnel junction (FTJ) devices, wherein at least one FTJ of the plurality of FTJ devices comprises:

first electrode;

a second electrode;

a ferroelectric material between the first and second electrodes; and an interface material between at least one of the first and second electrodes and the ferroelectric material; and a plurality of microchannels within the IC die, the microchannels to convey a heat transfer fluid that maintains an operating temperature of the IC die at or below −25° C.

2. The IC die of claim 1, wherein the interface material comprises zinc oxide and is in a vertical orientation that spans two or more layers of the IC die.

3. The IC die of claim 1, wherein the ferroelectric material comprises hafnium zirconium oxide (HZO), lanthanum hafnium oxide (LHO), or lead zirconium titanate, and wherein the interface material comprises zinc oxide and is in a horizontal orientation on a single layer of the IC die.

4. The IC die of claim 1, wherein each of the at least one FTJ device is within a memory circuit.

5. The IC die of claim 1, further comprising a diode that includes the at least one FTJ device and wherein the diode is operable at below 50 mV.

6. The IC die of claim 1, wherein the interface material is between the ferroelectric material and the first electrode and further comprising:

a block material between the ferroelectric material and the second electrode and wherein the block material comprises aluminum oxide.

7. The IC die of claim 6, wherein the heat transfer fluid is to maintain an operating temperature of the IC die at or below −70° C.

8. A system, comprising:

a substrate;

a power supply;

an integrated circuit (IC) die attached to the substrate and coupled to the power supply, the IC die comprising a plurality of ferroelectric tunnel junction (FTJ) devices, wherein at least one FTJ of the plurality of FTJ devices comprises:

a first electrode;

a second electrode;

a ferroelectric material between the first and second electrodes; and an interface material between at least one of the first and second electrodes and the ferroelectric material; and a cooling structure operable to remove heat from the IC die to achieve an IC die operating temperature at or below −50° C., wherein the cooling structure comprises a plurality of microchannels within the IC die or a package of the IC die, the microchannels to convey a heat transfer fluid.

9. The system of claim 8, wherein the heat transfer fluid comprises helium-3, helium-4, hydrogen, neon, air, fluorine, argon, oxygen, or methane.

10. The system of claim 8, wherein the at least one FTJ device further comprises:

a block material disposed between at least one of the first and second electrodes and the ferroelectric material, wherein the block material comprises aluminum oxide.

11. The system of claim 10, further comprising a metal-insulator-metal (MIM) capacitor that includes the at least one FTJ device.

12. The system of claim 8, wherein the cooling structure is to remove heat from the IC die to achieve an operating temperature at or below −70° C.

13. The system of claim 12, wherein the IC die comprises a plurality of metallization layers over a front side of the plurality of FTJ devices, the metallization layers to provide signal routing for the plurality of FTJ devices, and wherein the microchannels are within the IC die and located over the plurality of metallization layers.

14. The system of claim 13, wherein the cooling structure further comprises a chiller mounted to the IC die over the microchannels, the chiller comprising one of a solid body comprising second microchannels to convey a second heat transfer fluid therein or a heat sink for immersion in a low-boiling point liquid.

15. The system of claim 8, wherein the cooling structure is to convey liquid nitrogen to achieve an operating temperature at or below about −196° C.

* * * * *